(12) United States Patent
Sakamoto et al.

(10) Patent No.: US 12,183,647 B2
(45) Date of Patent: *Dec. 31, 2024

(54) PACKAGING OF A SEMICONDUCTOR DEVICE WITH DUAL SEALING MATERIALS

(71) Applicant: Mitsubishi Electric Corporation, Tokyo (JP)

(72) Inventors: Soichi Sakamoto, Tokyo (JP); Junji Fujino, Tokyo (JP); Hiroshi Kawashima, Tokyo (JP); Taketoshi Maeda, Hiroshima (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/196,317

(22) Filed: Mar. 9, 2021

(65) Prior Publication Data
US 2021/0193546 A1 Jun. 24, 2021

Related U.S. Application Data

(62) Division of application No. 16/485,183, filed as application No. PCT/JP2018/007504 on Feb. 28, 2018, now Pat. No. 11,004,761.

(30) Foreign Application Priority Data
Feb. 28, 2017 (JP) .................. 2017-036976

(51) Int. Cl.
*H01L 23/31* (2006.01)
*H01L 23/00* (2006.01)
(Continued)

(52) U.S. Cl.
CPC .......... *H01L 23/3142* (2013.01); *H01L 23/08* (2013.01); *H01L 23/29* (2013.01); *H01L 23/4334* (2013.01); *H01L 24/48* (2013.01)

(58) Field of Classification Search
CPC ..... H01L 33/56; H01L 23/3142; H01L 23/08; H01L 23/29; H01L 23/4334; H01L 24/48;
(Continued)

(56) References Cited

U.S. PATENT DOCUMENTS 5,012,323 A  4/1991 Farnworth
5,831,836 A  11/1998 Long et al.
(Continued)

FOREIGN PATENT DOCUMENTS

JP  S5910245 A  1/1984
JP  H05082678 A  4/1993
(Continued)

OTHER PUBLICATIONS

International Search Report (PCT/ISA/210) and translation and Written Opinion (PCT/ISA/237) dated May 22, 2018, by the Japanese Patent Office as the International Searching Authority for International Application No. PCT/JP2018/007504.
(Continued)

*Primary Examiner* — Wasiul Haider
(74) *Attorney, Agent, or Firm* — Buchanan Ingersoll & Rooney PC

(57) ABSTRACT

The present invention provides a semiconductor device including an insulating layer, a conductive layer bonded to one main surface of the insulating layer, a semiconductor element arranged such that the upper surface of the semiconductor element faces a direction same as the one main surface of the insulating layer, an upper electrode provided on the upper surface of the semiconductor element, a wiring member that has one end electrically bonded to the upper electrode of the semiconductor element and has another end electrically bonded to the conductive layer, and has a hollow portion, a first sealing material, and a second sealing material, in which the first sealing material seals at least part of (Continued)

the semiconductor element so as to be in contact with the semiconductor element, and the second sealing material seals the wiring member so as to be in contact with the wiring member.

12 Claims, 10 Drawing Sheets

(51) Int. Cl.
*H01L 23/08* (2006.01)
*H01L 23/29* (2006.01)
*H01L 23/433* (2006.01)

(58) Field of Classification Search
CPC . H01L 23/3135; H01L 23/3121; H01L 23/04; H01L 23/13; H01L 23/49838; H01L 23/50; H01L 23/12
See application file for complete search history.

(56) References Cited

U.S. PATENT DOCUMENTS

| | | | |
|---|---|---|---|
| 6,625,028 B1* | 9/2003 | Dove | H01L 23/552 257/659 |
| 2010/0164083 A1* | 7/2010 | Yim | H01L 25/50 257/E23.18 |
| 2012/0091493 A1 | 4/2012 | Lin et al. | |
| 2012/0094442 A1* | 4/2012 | Lin | H05K 1/021 438/118 |
| 2013/0083505 A1* | 4/2013 | Kobayashi | H05K 1/0245 174/250 |
| 2014/0070397 A1 | 3/2014 | Viswanathan et al. | |
| 2014/0306245 A1* | 10/2014 | Hayashi | H01L 33/58 257/98 |
| 2017/0077069 A1* | 3/2017 | Danno | H01L 23/047 |
| 2017/0323844 A1* | 11/2017 | Karlicek, Jr. | H01L 24/83 |
| 2017/0330812 A1* | 11/2017 | Bolognia | H01L 23/3107 |
| 2020/0043822 A1 | 2/2020 | Sakamoto et al. | |

FOREIGN PATENT DOCUMENTS

| | | | |
|---|---|---|---|
| JP | 1995180703 A | | 6/1995 |
| JP | H09-8076 A | * | 6/1995 |
| JP | H10209344 A | | 8/1998 |
| JP | 2000332160 A | | 11/2000 |
| JP | 2001267340 A | | 9/2001 |
| JP | 2006351737 A | | 12/2006 |
| JP | 2008275357 A | | 11/2008 |
| JP | 2013008720 A | | 1/2013 |
| JP | 2016081943 A | | 5/2016 |

OTHER PUBLICATIONS

Office Action dated Mar. 10, 2022, issued in the corresponding German patent Application No. 112018001053.8, 11 pages including 5 pages of English Translation.
Office Action issued in Chinese Patent Application No. 201880013261.3; Mailed Nov. 16, 2022. 13 Pages (with Translation).

* cited by examiner

PACKAGING OF A SEMICONDUCTOR DEVICE WITH DUAL SEALING MATERIALS

TECHNICAL FIELD

The present invention relates to a semiconductor device, and for example, to a semiconductor device that handles high frequency signals.

BACKGROUND ART

In recent years, speeding up communication of mobile communication devices such as mobile phones and smart phones has become a trend with the spread of the Internet. Also, demand for safety is increasing, such as necessity of transmission and reception of images through disaster prevention radio communication. Along with this, increasing the reliability of high frequency communication packages, which are key devices, is urgently needed.

High frequency packages are semiconductor devices that input and output signals of frequencies higher than several tens of MHz, while amplifying and matching the signals. With the demand for speeding up communication, high output of semiconductor devices is required. In a semiconductor device with a high output, a package structure with high heat dissipation is required. In a package structure with high heat dissipation, a base plate is adopted, the base plate being obtained by bonding an insulating layer such as glass epoxy to a heat dissipation plate formed of a material, such as copper (Cu), excellent in heat dissipation.

For such a base plate, a package is formed by: cutting the glass epoxy layer by machining or the like: die-bonding a semiconductor element to a metal plate exposed in a recess of a metal base substrate; forming wiring by wire bonding; and performing resin sealing for dustproof.

The thermal expansion coefficients of silicon (Si), gallium arsenide (GaAs), silicon carbide (SiC), gallium nitride (GaN), and the like, which are substrates of semiconductor elements, are within the range of about 3 ppm/K to about 6 ppm/K (inclusive). These values are remarkably small compared to the thermal expansion coefficient (16 ppm/K) of Cu that constitutes a base plate to be used for heat dissipation. Therefore, there is the possibility that a crack or the like may occur in a die-bonding portion where the semiconductor element and the base plate are bonded together, due to thermal stress generated: in a die-bonding step of a manufacturing process; in temperature cycles in reliability evaluation; or the like, so that heat dissipation deteriorates. Then, measures have been taken, the measures including sealing the semiconductor element with a sealing material, such as an epoxy resin, in which fillers are dispersed to reinforce the die-bonding portion, for example. However, there has been the possibility that the sealing material may be peeled off the base plate since a warp is caused in the base plate due to the difference between the expansion coefficients of the sealing material and the base plate. There is the concern that a wire bonding portion may be damaged due to the peeling of the sealing material.

For example, in Patent Document 1, a method is proposed, in which the periphery of a flip-chip mounted element and other portions are sealed with materials having different physical properties. In Patent Document 2, a method of ensuring reliability is provided, in which the periphery of an element is sealed with hard epoxy and the whole is with a flexible urethane resin.

PRIOR ART DOCUMENTS

Patent Documents

Patent Document 1: Japanese Patent Application Laid-Open No. H10-209344 (1998)
Patent Document 2: Japanese Patent Application Laid-Open No. 2006-351737

SUMMARY

Problem to be Solved by the Invention

As described above, with the speeding up of communication and higher output of semiconductor devices, the thermal stress generated in the semiconductor devices is also increasing. Therefore, the demand for semiconductor devices with improved reliability against thermal stress is further increasing.

The present invention has been made in order to solve the above problem, and an object of the invention is to provide a semiconductor device with further improved reliability against thermal stress.

Means to Solve the Problem

The present invention provides a semiconductor device including an insulating layer, a conductive layer bonded to one main surface of the insulating layer, a semiconductor element arranged such that an upper surface of the semiconductor element faces a direction same as the one main surface of the insulating layer, an upper electrode provided on the upper surface of the semiconductor element, a wiring member that has one end electrically bonded to the upper electrode of the semiconductor element and has another end electrically bonded to the conductive layer, and has a hollow portion, a first sealing material, and a second sealing material softer than the first sealing material, in which the first sealing material seals at least part of the semiconductor element so as to be in contact with the semiconductor element, and the second sealing material seals the wiring member so as to be in contact with the wiring member.

Effects of the Invention

In the semiconductor device according to the present invention, the semiconductor element is sealed with the relatively hard first sealing material, and hence peeling of the semiconductor element can be suppressed. Further, the wiring member is sealed with the relatively soft second sealing material, and hence the wiring member can be protected from dust and thermal stress to the wiring member can be reduced even if thermal stress is applied to the circumference of the wiring member due to a warp caused in the insulating layer and the conductive layer, or the like. Therefore, the reliability of the semiconductor device can be improved. Furthermore, in the semiconductor device according to the present invention, the first sealing material seals the semiconductor element so as to be in contact with the semiconductor element, and hence the semiconductor element can be uniformly sealed. Similarly, the second sealing material seals the wiring member so as to be in contact with the wiring member, and hence the wiring member can be uniformly sealed. Therefore, the reliability of the semiconductor device can be further improved.

The objects, features, aspects and advantages of the present invention will become more apparent from the following detailed description of the present invention when taken in conjunction with the accompanying drawings.

DESCRIPTION OF EMBODIMENTS

First Embodiment

Figure 1:
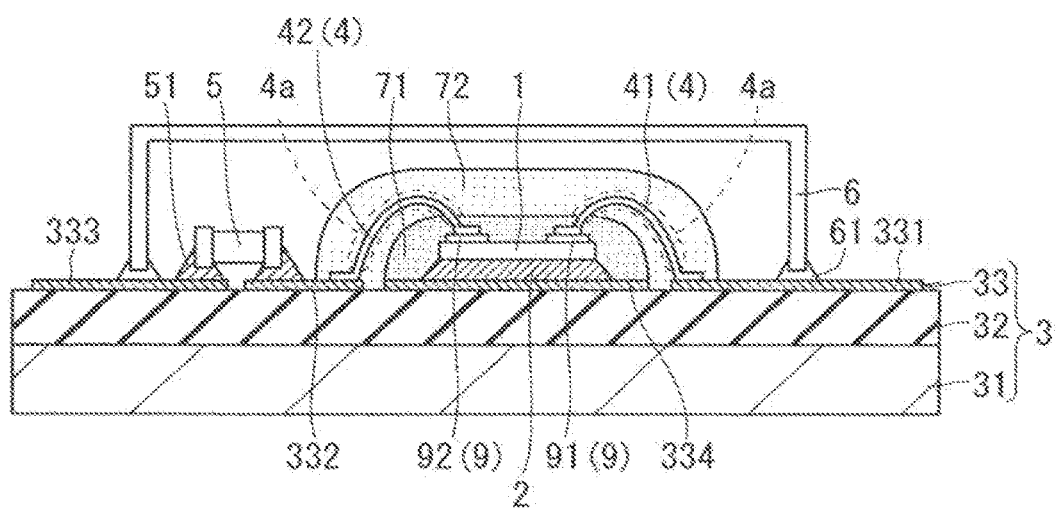
FIG. 1 is a cross sectional view of a semiconductor device according to a first embodiment.
Figure 2:
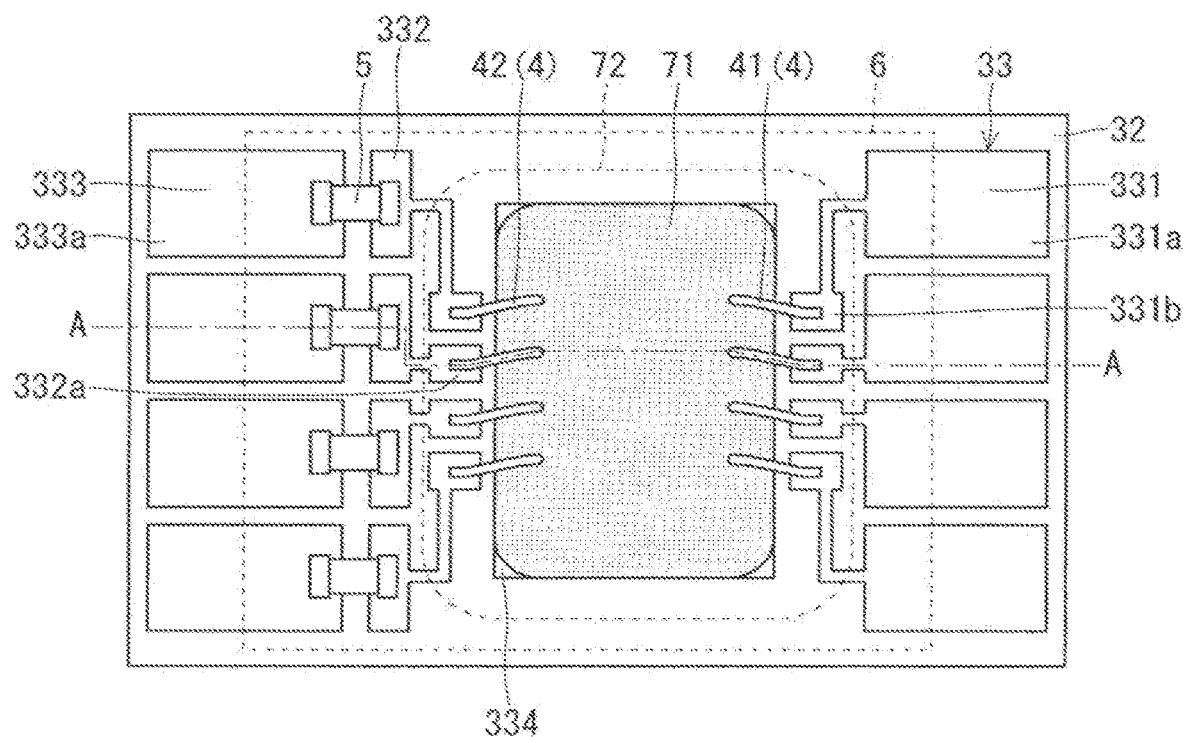
FIG. 2 is a plan view of the semiconductor device according to the first embodiment.

FIG. 1 is a cross sectional view of a semiconductor device according to a first embodiment. FIG. 2 is a plan view of the semiconductor device according to the first embodiment. The cross section of the semiconductor device illustrated in FIG. 1 is taken along line A-A of FIG. 2. In FIG. 2, a second sealing material 72 and a cap 6 are illustrated by virtual lines for easy understanding of the drawing.

The semiconductor device according to the first embodiment includes an insulating layer 32, a conductive layer 33, a heat dissipation plate 31, a semiconductor element 1, a plurality of wiring members 4, a first sealing material 71, and the second sealing material 72. A base substrate 3 is composed of the heat dissipation plate 31, the insulating layer 32, and the conductive layer 33. The insulating layer 32 is bonded to the upper surface of the heat dissipation plate 31. The conductive layer 33 is bonded to the upper surface of the insulating layer 32.

The plurality of the wiring members 4 include an input side wiring member 41 and an output side wiring member 42. When the input side and the output side are not particularly distinguished, each of them is simply described as the wiring member 4. The wiring member 4 is provided with a hollow portion 4a. As illustrated in FIG. 1, the hollow portion 4a is a portion that exists between portions to which both the ends of the wiring member 4 are respectively bonded.

The conductive layer 33 is composed of a plurality of conductive patterns 331, 332, 333, and 334 isolated from each other. Each of the plurality of the conductive patterns 331 is provided with an external electrode portion 331a to which a high frequency signal is to be input, and a wiring member bonding portion 331b. Each of the plurality of the conductive patterns 332 is provided with a wiring member bonding portion 332a. Each of the plurality of the conductive patterns 333 is provided with an external electrode portion 333a that outputs a high frequency signal.

The semiconductor element 1 is, for example, a power amplifier element of MHz band made of Si. The semiconductor element 1 is provided, on its upper surface, with a plurality of upper electrodes 9. The upper electrodes 9 include an input side upper electrode 91 and an output side upper electrode 92. When the input side and the output side are not particularly distinguished, each of them is simply described as the upper electrode 9. The upper electrode 9 is made of an alloy containing, for example, aluminum (Al). The lower surface of the semiconductor element 1 is bonded to the conductive pattern 334 via a bonding material 2.

The input side upper electrode 91 of the semiconductor element 1 and the conductive pattern 331 are electrically bonded with the wiring member 41. That is, one end of the wiring member 41 is bonded to the input side upper electrode 91 of the semiconductor element 1, and the other end of the wiring member 41 is bonded to the wiring member bonding portion 331b of the conductive pattern 331. The output side upper electrode 92 of the semiconductor element 1 and the conductive pattern 332 are electrically bonded with the wiring member 42. That is, one end of the wiring member 42 is electrically bonded to the output side upper electrode 92 of the semiconductor element 1, and the other end of the wiring member 42 is electrically bonded to the wiring member bonding portion 332a of the conductive pattern 332. In the first embodiment, the wiring member 4 is, for example, an Al wire having a diameter of 0.15 mm.

Each of the plurality of the conductive patterns 332 and a corresponding one of the plurality of the conductive patterns 333 are electrically connected via an electronic component 5 for adjusting high frequency characteristics. The external electrode portion 331a of the conductive pattern 331 is used as an external electrode of the semiconductor device. The external electrode portion 333a of the conductive pattern 333 is used as an external electrode of the semiconductor device.

As illustrated in FIG. 1, the semiconductor element 1 is sealed with the first sealing material 71. The first sealing material 71 is, for example, an epoxy resin. The expansion coefficient is adjusted to about 16 ppm/K by dispersing silica fillers in the epoxy resin.

The surface of the semiconductor element 1 is sealed with the first sealing material 71. The first sealing material 71 is in contact with the semiconductor element 1. The upper surface of the conductive pattern 334 and the bonding material 2 are also sealed with the first sealing material 71. The first sealing material 71 is also in contact with the conductive pattern 334 and the bonding material 2.

The second sealing material 72 seals the wiring member 4 and the semiconductor element 1 sealed with the first sealing material 71. The second sealing material 72 is softer than the first sealing material 71. The second sealing material 72 is, for example, silicone gel. The second sealing material 72 is in contact with the surface of the wiring member 4.

The cap 6 is fixed to the conductive layer 33 with an adhesive 61 so as to cover the semiconductor element 1, the wiring member 4, the first and second sealing materials 71 and 72, and the like. The cap 6 is, for example, a polyphenylene sulfide (PPS) resin. The adhesive 61 is, for example, a silicone adhesive.

In the first embodiment, one semiconductor element 1 is arranged on the upper surface of the conductive pattern 334, but a plurality of the semiconductor elements 1 may be arranged on the upper surface of the conductive pattern 334. The semiconductor element 1 is a high frequency power amplifier that power amplifies a high frequency signal input via the input side upper electrode 91 and outputs the amplified high frequency signal from the output side upper electrode 92.

As the semiconductor element 1 to be mounted in the package of the semiconductor device of the first embodiment, not only an element having the above power amplification function, but also an element having a high frequency signal switching function may be adopted. The high frequency signal is a signal of a frequency higher than several tens of MHz. The semiconductor element 1 may be, for example, a MOS-FET (Metal Oxide Semiconductor) or LDMOS (Lateral double Diffused MOSFET) containing silicon. Alternatively, the semiconductor element 1 may be a GaAs-HFET (Heterostructure Field Effect Transistor) or GaAs-HBT (Heterojunction Bipolar Transistor) containing gallium arsenide phosphide that is a compound semiconductor. Alternatively, the semiconductor element 1 may be a GaN-HFET (Heterostructure Field Effect Transistor) containing gallium nitride. A semiconductor element made of gallium nitride, which is a wide band gap semiconductor, has various merits including high electron velocity, high breakdown voltage because of wide band gap, being capable of high power operation, wide operating bandwidth, being capable of high temperature operation, low cost, and being capable of miniaturization. When a plurality of the semiconductor elements 1 are arranged on the upper surface of the conductive pattern 334, the plurality of the semiconductor elements 1 may be composed of the same semiconductor elements or different semiconductor elements.

The heat dissipation plate 31 has a function of dissipating a lot of heat toward the outside, the heat being generated while the semiconductor element 1 is operating. Heat dissipation takes place both by heat transfer to the air due to convection and radiation and by heat conduction in which heat is transferred through objects in contact with each other. Therefore, the heat generated from the semiconductor element 1 can be effectively dissipated outside via the heat dissipation plate 31 by forming the heat dissipation plate 31 with a material excellent in thermal conductivity and by cooling a heat sink (not illustrated) arranged on a surface of the heat dissipation plate 31, the surface being opposite to the semiconductor element 1, with air cooling, water cooling, or the like.

In the first embodiment, the heat dissipation plate 31 made of Cu is used, but the material of the heat dissipation plate 31 is not limited to this. The heat dissipation plate 31 may be made, for example, of a metal material such as iron (Fe), tungsten (W), molybdenum (Mo), nickel (Ni), or cobalt (Co), or of an alloy material containing these metal materials. Alternatively, the heat dissipation plate 31 may be made of a composite material in which these metal materials or alloy materials are combined.

An alloy (Cu—W) of copper and tungsten is a composite material that combines the low thermal expansion of tungsten and the high thermal conductivity of copper. The thermal expansion coefficient can be adjusted in accordance with a surrounding material by changing the composition ratio of tungsten to copper. An alloy (Cu—Mo) of copper and molybdenum can be expected to have a higher thermal conductivity than Cu—W, and is a material whose thermal expansion coefficient and thermal conductivity can be similarly adjusted by changing the composition ratio of molybdenum to copper. Also, a clad material having a three-layer structure, obtained by using Cu—Mo as a core material and by bonding Cu to both the sides; and the like can be mentioned. Since the surface of this clad material is pure copper, surface heat dispersion can be increased.

The insulating layer 32 is a glass epoxy substrate such as FR (Flame Retardant)-4 or FR-5. The insulating layer 32 may be an alumina substrate. The material of the conductive layer 33 is not particularly limited as far as it has conductivity. The conductive layer 33 may be formed of a material mainly containing Cu, Al, and the like. Alternatively, the conductive layer 33 may be formed by plating a conductive material, such as Au or Ag, on the insulating layer 32.

In the first embodiment, the wiring member bonding portions 331b are isolated from each other in the plurality of the conductive patterns 331, as illustrated in FIG. 2, but the wiring member bonding portions 331b may be united without being isolated. In this case, when a wire as the wiring member 41 is wire bonded, it is sufficient to set the distance and height between the upper electrode 9 of the semiconductor element 1 and the wiring member bonding portion 331b, and hence accurate alignment for each wiring member bonding portion 331b becomes unnecessary. Therefore, the time necessary for the wire bonding can be shortened.

When the wiring member bonding portion 331b is isolated for each wiring member 41, as illustrated in FIG. 2, the area where the insulating layer 32 and the second sealing material 72 closely adhere to each other is increased, and hence reliability is improved. Thus, the shape of the wiring member bonding portion 331b may be determined in consideration of trade-off between takt time in manufacturing and reliability. Also, the shapes of the wiring member bonding portions 332a of the plurality of the conductive patterns 332 are determined in consideration of trade-off between takt time in manufacturing and reliability.

The number of the conductive patterns 334 may be one or more like the semiconductor element 1, and in the first embodiment, the case where one conductive pattern 334 is provided is described. Although not described in the first embodiment, a solder resist may be formed on the insulating layer 32 in order to control the range of the wet spreading of a bonding material 51 for bonding the electronic component 5.

The base substrate 3 is composed of the heat dissipation plate 31, the insulating layer 32, and the conductive layer 33. The heat dissipation plate 31 is bonded to the insulating layer 32 via a fiber reinforced resin material like an epoxy resin reinforced by a glass cloth. It is desirable that the softening temperature of the fiber reinforced resin material is higher than the melting point of the bonding material 51.

The electronic component 5 is, for example, a chip resistor. The chip resistor is mounted on the conductive layer 33 to adjust the high frequency characteristics of the semiconductor element 1. In the first embodiment 1, a chip resistor is mounted as the electronic component 5, but the electronic component 5 may be, for example, a chip capacitor or the like. One or more electronic components 5 are required, which is mounted on the conductive layer 33. When a plurality of the electronic components 5 are mounted, they may be the same as or different from each other. The electronic component 5 is bonded to the conductive layer 33 with the bonding material 51. The bonding material 51 is, for example, a solder paste. The solder paste is not limited to a Pb-based solder, and may be a Pb-free solder like SAC305.

The semiconductor element 1 is bonded to the conductive pattern 334 of the conductive layer 33 via the bonding material 2. In the first embodiment, the bonding materials 2 is a solder alloy such as Au—Sn, Au—Ge, or Au—Si. The bonding material 2 is not limited to a solder alloy with a low melting point, and may be a conductive adhesive in which metal fillers with high thermal conductivity are dispersed. The conductive adhesive can be die-bonded at a low temperature lower than or equal to 200° C., which can reduce occurrence of thermal stress to be applied to the surrounding members and a warp, both possibly being caused during the die-bonding. Ag fillers are generally used as the metal fillers to be dispersed in the conductive adhesive, but metals other than Ag may be adopted and Cu fillers, Ni fillers, Au fillers, Pd fillers, carbon fillers, or the like can offer the same effects as Ag fillers.

In addition, as the bonding material 2, a sinterable metal paste may be used, in which micro-sized metal particles, nano-sized metal particles, or micro-sized and nano-sized metal particles are mixed in a solvent. The sinterable metal paste can be die-bonded at about 200° C. like the conductive adhesive. Further, in a sinterable metal paste after sintering, metal particles are sinter-bonded together to produce a state close to a metal-bulk state, and hence very high heat resistance can be obtained. As a result, the reliability during high temperature operation at 175° C. or higher can be improved. As the sinterable metal paste, an Ag paste using Ag particles is generally used, but particles other than Ag may be used and a paste, in which Cu particles, Ni particles, Au particles, or the like are mixed in a solvent, can offer the same effects.

The epoxy resin to be used as the first sealing material 71 is a hard resin having a relatively high Young's modulus. Therefore, the reliability of the semiconductor device against thermal stress can be improved by covering and holding the semiconductor element 1 and the bonding material 2. The flexural modulus of the epoxy resin is within the range of 100 MPa to 20000 MPa (inclusive), the glass transition temperature Tg is within the range of 140° C. to 210° C. (inclusive), and the thermal expansion coefficient al is within the range of $10 \times 10'/K$ to $50 \times 10^{-6}/K$ (inclusive) at a temperature lower than or equal to Tg. The flexural modulus of the first sealing material 71 is more preferably about 150 MPa, the glass transition temperature Tg is more preferably within the range of 175° C. to 210° C. (inclusive), and the thermal expansion coefficient al is more preferably within the range of $10 \times 10^{-6}/K$ to $20 \times 10^{-6}/K$ (inclusive) at a temperature lower than or equal to Tg. When the glass transition temperature is 175° C. or higher, it can be avoided that the linear expansion coefficient may be rapidly increased by 2 to 4 times even at the maximum temperature during the operation of the semiconductor device, whereby the reliability during high temperature operation can be ensured. The first sealing material 71 is not limited to an epoxy resin, and a material having any molecular structure may be adopted as far as the above physical properties are satisfied.

Since the silicone gel to be used also as the second sealing material 72 is a relatively soft resin, deformation due to thermal stress can be absorbed. Therefore, it plays the role of protecting the wiring member 4 from dust without putting a heavy load on the wiring member 4. The silicone gel is not particularly limited, but it is desirable that: the silicone gel is a one-liquid type that is easy to use; it sufficiently adheres to metals, ceramics, glass, and the like; the curing temperature is 200° C. or lower; the flexural modulus is within the range of 1 MPa to 5 MPa (inclusive); the viscosity is within the range of 10 Pa·s to 20 Pa·s (inclusive); and the penetration depth after curing is within the range of 30 to 100 (inclusive) (penetration depth is measured according to JIS K 6249). The second sealing material 72 is not limited to silicone gel, and a material having any molecular structure may be adopted as far as the above physical properties are satisfied. The above flexural moduli of the first and second sealing materials 71 and 72 are values based on the specification of JIS K 6911 (General Test Method for Thermosetting Plastics).

<Manufacturing Method>

A manufacturing method of the semiconductor device according to the first embodiment will be described. First, the base substrate 3 is provided. Next, the electronic component 5 is bonded to the conductive layer 33 by a reflow process. That is, the bonding material 51, i.e., the solder paste is arranged on the conductive patterns 332 and 333 of the conductive layer 33 of the base substrate 3, and the bonding material 51 is heated to be melted in a state where the electronic component 5 is mounted on the bonding material 51.

Next, the semiconductor element 1 is bonded to the conductive pattern 334 with the bonding material 2. The bonding material 2 is a conductive adhesive in which silver (Ag) fillers are dispersed in an epoxy resin. The bonding is performed by heating at 150° C. for 2 hours in a state where the semiconductor element 1 is arranged above the conductive pattern 334 via the bonding material 2.

Next, the input side upper electrode 91 of the semiconductor element 1 and the conductive pattern 331 are bonded together with a wire, i.e., the wiring member 41 by wire bonding. Also, the output side upper electrode 92 of the semiconductor element 1 and the conductive pattern 332 are bonded together with a wire, i.e., the wiring member 42 by wire bonding.

Next, an epoxy resin is supplied with a dispenser as the first sealing material 71 for the semiconductor element 1. The epoxy resin is cured by heating at 130° C. for 1.5 hours. As a result, the semiconductor element 1 is sealed with the first sealing material 71.

Next, silicone gel is applied, from the outside of the first sealing material 71, to the periphery of the semiconductor element as the second sealing material 72. The silicone gel is cured by heating at 130° C. for 30 minutes. As a result, the semiconductor element 1 is sealed from the outside of the first sealing material 71 with the second sealing material 72. Also, the wiring member 4 is sealed with the second sealing material 72.

Finally, the cap 6 is adhered to the conductive layer 33 with the adhesive 61 so as to cover the semiconductor element 1, the wiring member 4, the electronic component 5, and the like. The adhesive 61 is, for example, a silicone adhesive and is cured by heating at 120° C. for 1 hour.

<Effects>

The semiconductor device according to the first embodiment includes the insulating layer 32, the conductive layer 33 bonded to one main surface of the insulating layer 32, and the semiconductor element 1 arranged such that the upper surface of the semiconductor element 1 faces a direction same as the one main surface of the insulating layer 32, and the semiconductor device further includes the upper electrode 9 provided on the upper surface of the semiconductor element 1, the wiring member 4 that has one end electrically bonded to the upper electrode 9 of the semiconductor element 1 and has another end electrically bonded to the conductive layer 33, and has the hollow portion 4a, the first sealing material 71, and the second sealing material 72 softer than the first sealing material 71, in which the first sealing material 71 seals at least part of the semiconductor element 1 so as to be in contact with the semiconductor element 1, and the second sealing material 72 seals the wiring member 4 so as to be in contact with the wiring member 4.

In the semiconductor device according to the first embodiment, the semiconductor element 1 is sealed with the relatively hard first sealing material 71, and hence peeling of the semiconductor element 1 can be suppressed. Further, the wiring member 4 is sealed with the relatively soft second sealing material 72, and hence the wiring member 4 can be protected from dust and stress to the wiring member 4 can be reduced even if stress is applied to the circumference of the wiring member 4 due to a warp caused in the insulating layer 32 and the conductive layer 33, or the like. Therefore, the reliability of the semiconductor device can be improved.

Furthermore, in the semiconductor device according to the first embodiment, the first sealing material 71 seals the semiconductor element 1 so as to be in contact with the semiconductor element 1, and hence the semiconductor element 1 can be uniformly sealed. Similarly, the wiring member 4 can be uniformly sealed by the second sealing material 72 sealing the wiring member 4 so as to be in contact with the wiring member 4. Therefore, the reliability of the semiconductor device can be further improved.

In the semiconductor device according to the first embodiment, an area of the wiring member 4 where the wiring member 4 is in contact with the second sealing material 72 is larger than an area of the wiring member 4 where the wiring member 4 is in contact with the first sealing material 71. That is, in the first embodiment, the periphery of a portion of the wiring member 4, in the portion the wiring member 4 being bonded to the upper electrode 9 of the semiconductor element 1, is sealed with the first sealing material 71, but most part of the wiring members 4 is sealed with the second sealing material 72, as illustrated in FIG. 1. Since most part of the wiring member 4 is sealed with the relatively soft second sealing material 72, thermal stress to the wiring member 4 can be reduced.

In the semiconductor device according to the first embodiment, the wiring member 4 is a wire Wires are generally susceptible to damage from external forces, such as disconnection. In the first embodiment, thermal stress to the wiring member 4 can be reduced by sealing the wire with the relatively soft second sealing material 72, even if a warp is caused in the base substrate 3.

In the semiconductor device according to the first embodiment, the flexural modulus of the second sealing material 72 is smaller than that of the first sealing material 71. For example, the flexural modulus of the second sealing material 72 is set to be within the range of 1 MPa to 5 MPa (inclusive), and that of the first sealing material 71 is set to about 150 MPa, in the first embodiment. The semiconductor element 1 can be firmly held to the conductive pattern 334 via the bonding material 2 by sealing the semiconductor element 1 with the first sealing material 71 that has a relatively large flexural modulus, i.e., that is relatively hard. Further, thermal stress to the wiring member 4 can be reduced by sealing the wiring member 4 with the second sealing material 72 that has a relatively small flexural modulus, i.e., that is relatively soft.

Second Embodiment

Figure 3:
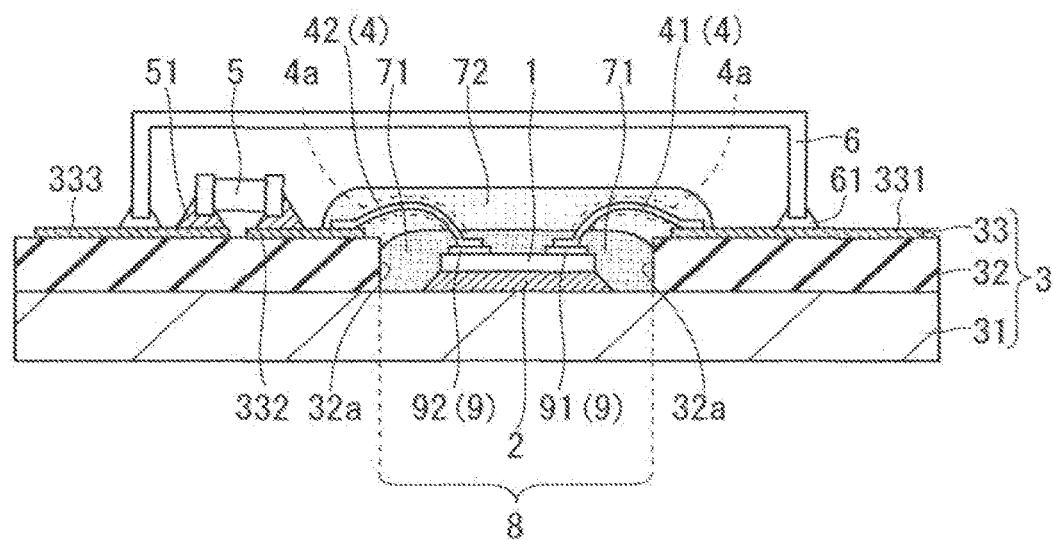
FIG. 3 is a cross sectional view of a semiconductor device according to a second embodiment.
Figure 4:
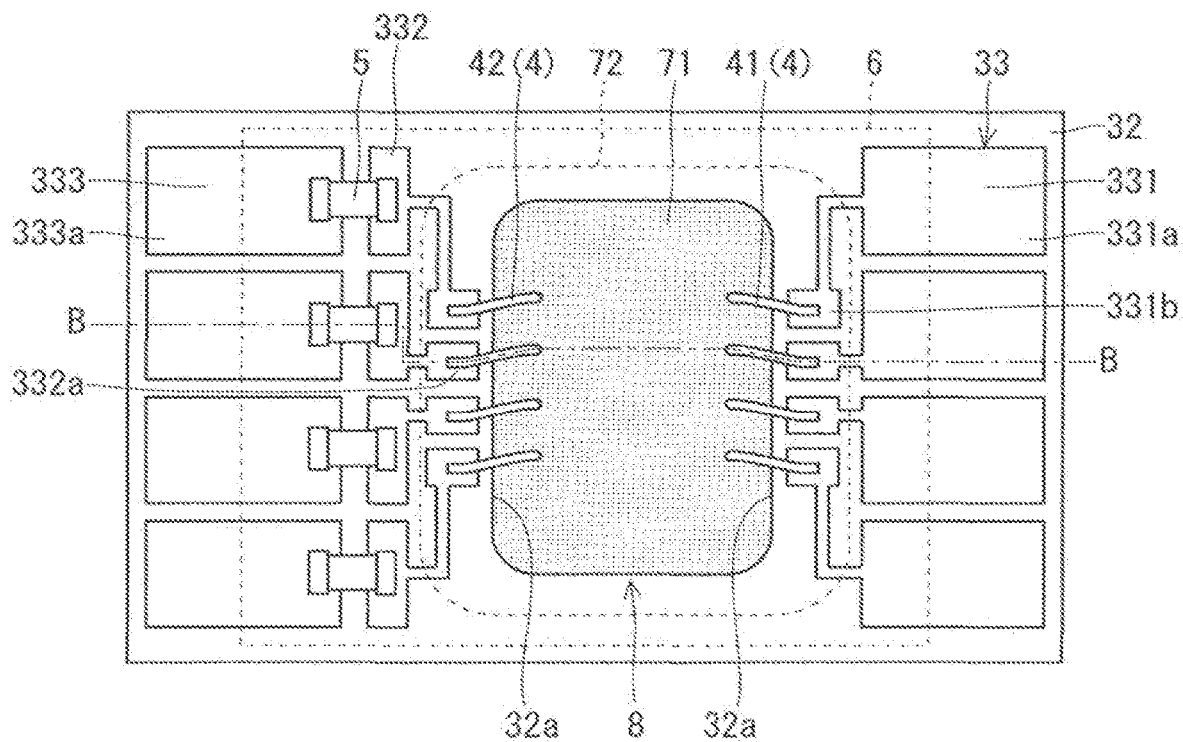
FIG. 4 is a plan view of the semiconductor device according to the second embodiment.

FIG. 3 is a cross sectional view of a semiconductor device according to a second embodiment. FIG. 4 is a plan view of the semiconductor device according to the second embodiment. The cross section of the semiconductor device illustrated in FIG. 3 is taken along line B-B of FIG. 4. In FIG. 4, a second sealing material 72 and a cap 6 are illustrated by virtual lines for easy understanding of the drawing.

In the second embodiment, an opening 8 is provided in almost the center of a base substrate 3. Since the length of a wiring member 4, one of the factors that reduce high frequency characteristics, can be shortened by providing the opening 8, a structure suitable for a high frequency semiconductor device can be achieved.

A heat dissipation plate 31 is not covered with an insulating layer 32 in the opening 8. The opening 8 is formed by cutting the insulating layer 32, for example, by machining. In the second embodiment, the opening 8 is provided in the base substrate 3, and hence a conductive layer 33 has a configuration in which the conductive pattern 334 described in the first embodiment is not included. In the second embodiment, the lower surface of a semiconductor element 1 is bonded to a heat dissipation plate 31 via a bonding material 2 in the opening 8 of the base substrate 3.

The opening 8 of the base substrate 3 and the semiconductor element 1 are sealed with a first sealing material 71. The first sealing material 71 is, for example, an epoxy resin. The first sealing material 71 has the physical characteristics described in the first embodiment.

The periphery of the opening 8 is sealed with a second sealing material 72. The second sealing material 72 is softer than the first sealing material 71. The second sealing material 72 is, for example, silicone gel. The second sealing material 72 seals the wiring member 4. The second sealing material 72 also seals the semiconductor element 1 from the outside of the first sealing material 71. The second sealing material 72 has the physical characteristics described in the first embodiment.

The semiconductor element 1 is arranged in the opening 8 of the base substrate 3. In the second embodiment, one semiconductor element 1 is arranged in the opening 8, but a plurality of the semiconductor elements 1 may be arranged in the opening 8. When a plurality of the semiconductor elements 1 are arranged in the opening 8, the plurality of the semiconductor elements 1 may be composed of the same semiconductor elements or different semiconductor elements.

The insulating layer 32 has the opening 8 having a depth reaching up to the heat dissipation plate 31, so that when the base substrate 3 alone is viewed in plan, the heat dissipation plate 31 is exposed outside. The number of the openings 8 may be one or more like the semiconductor element 1, and in the second embodiment, the case where one opening 8 is provided is described.

Since other configurations of the semiconductor device of the second embodiment are the same as the semiconductor device of the first embodiment, description thereof will be omitted.

<Manufacturing Method>

Figure 5:
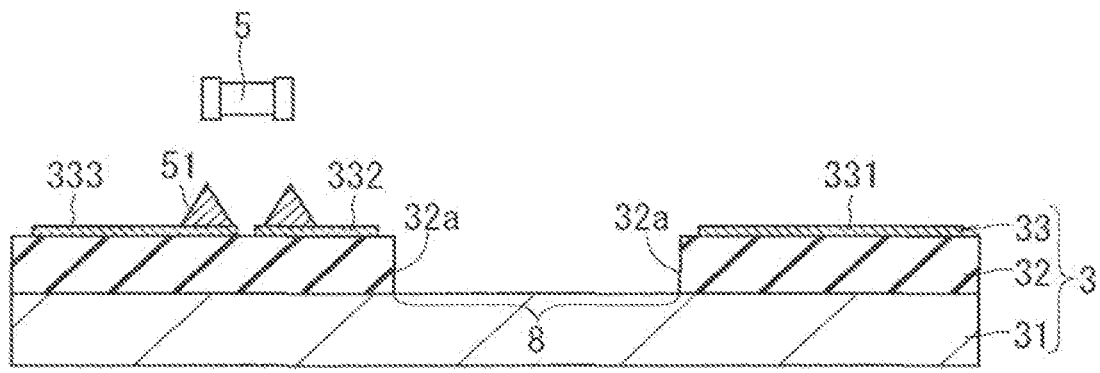
FIG. 5 is a view illustrating a manufacturing step of the semiconductor device according to the second embodiment.

FIGS. 5 to 9 are views each illustrating a manufacturing step of the semiconductor device according to the second embodiment. First, the base substrate 3 is provided. Next, an electronic component 5 is bonded to the conductive layer 33 by a reflow process, as illustrated in FIG. 5. That is, the bonding material 51, i.e., the solder paste is arranged on the conductive patterns 332 and 333 of the conductive layer 33 of the base substrate 3, and the bonding material 51 is heated to be melted in a state where the electronic component 5 is mounted on the bonding material 51.

Figure 6:
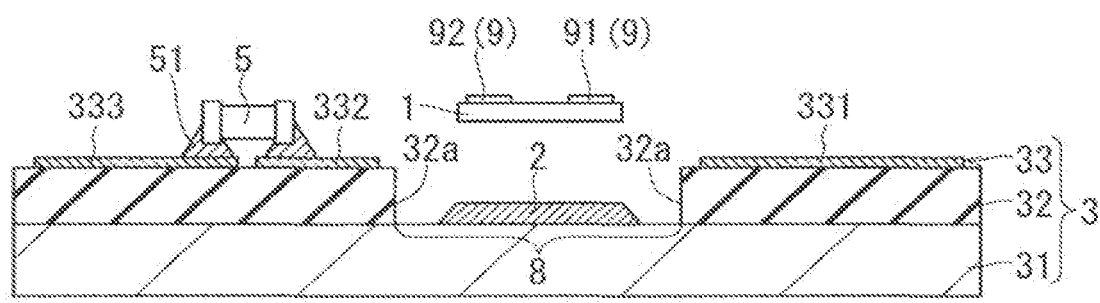
FIG. 6 is a view illustrating a manufacturing step of the semiconductor device according to the second embodiment.

Next, the semiconductor element 1 is bonded to the heat dissipation plate 31 with the bonding material 2, as illustrated in FIG. 6. The bonding material 2 is a conductive adhesive in which silver (Ag) fillers are dispersed in an epoxy resin. The bonding is performed by heating at 150° C. for 2 hours in a state where the semiconductor element 1 is arranged above the heat dissipation plate 31 via the bonding material 2.

Figure 7:
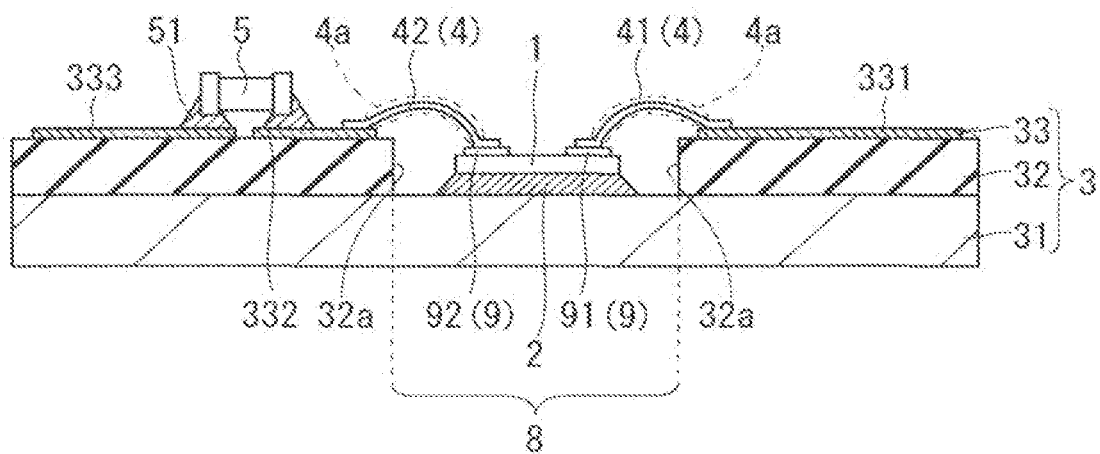
FIG. 7 is a view illustrating a manufacturing step of the semiconductor device according to the second embodiment.

Next, an input side upper electrode 91 of the semiconductor element 1 and a conductive pattern 331 are bonded together with a wire, i.e., a wiring member 41 by wire bonding, as illustrated in FIG. 7. Also, the output side upper electrode 92 of the semiconductor element 1 and the conductive pattern 332 are bonded together with a wire, i.e., the wiring member 42 by wire bonding.

Figure 8:
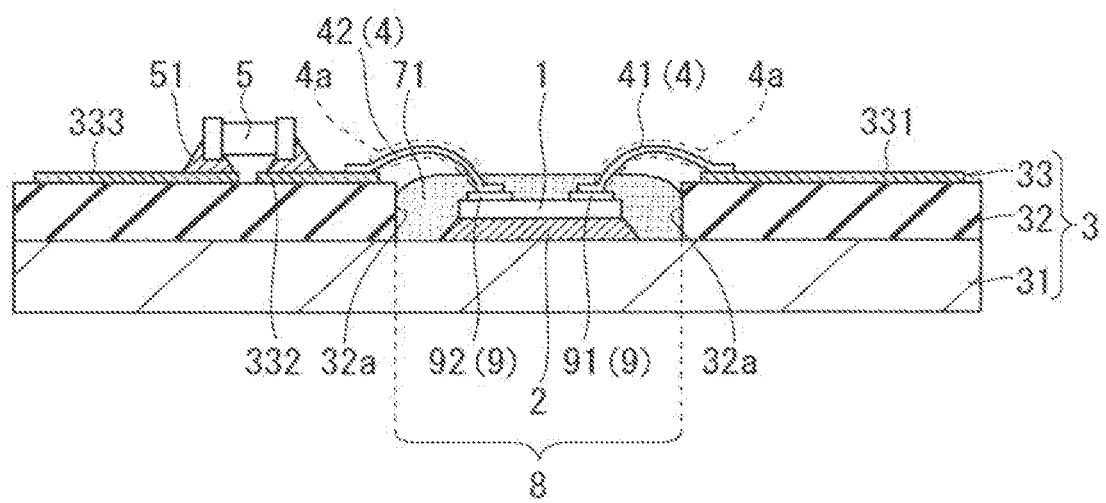
FIG. 8 is a view illustrating a manufacturing step of the semiconductor device according to the second embodiment.

Next, an epoxy resin is supplied with a dispenser as the first sealing material 71 for the opening 8, as illustrated in FIG. 8. The epoxy resin is cured by heating at 130° C. for 1.5 hours. As a result, the opening 8 and the semiconductor element 1 is sealed with the first sealing material 71.

Figure 9:
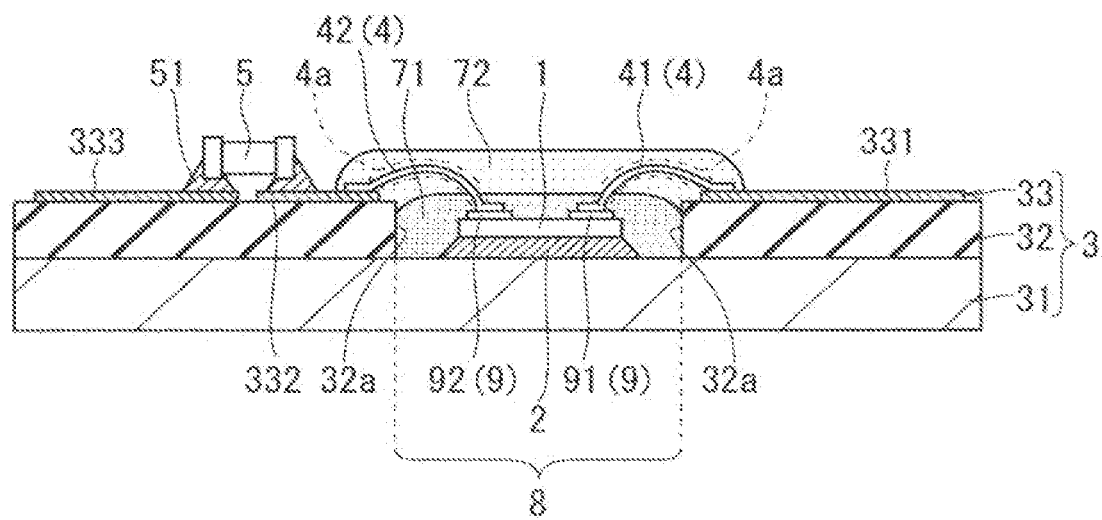
FIG. 9 is a view illustrating a manufacturing step of the semiconductor device according to the second embodiment.

Next, the silicone gel is applied, from the outside of the first sealing material 71, to the periphery of the semiconductor element as the second sealing material 72, as illustrated in FIG. 9. The silicone gel is cured by heating at 130° C. for 30 minutes. As a result, the semiconductor element 1 is sealed from the outside of the first sealing material 71 with the second sealing material 72. Also, the wiring member 4 is sealed with the second sealing material 72.

Finally, the cap 6 is adhered to the conductive layer 33 with the adhesive 61 so as to cover the semiconductor element 1, the wiring member 4, the electronic component 5, and the like. The adhesive 61 is cured by heating at 120° C. for 1 hour. The semiconductor device illustrated in FIG. 3 is obtained through the above manufacturing steps.

<Effects>

The semiconductor device according to the second embodiment further includes the heat dissipation plate 31, in which: another main surface of the insulating layer 32 is bonded to one main surface of the heat dissipation plate 31; the opening 8, where the heat dissipation plate 31 is not covered with the insulating layer 32, is provided on the one main surface of the heat dissipation plate 31; the lower surface of the semiconductor element 1 is bonded to the one main surface of the heat dissipation plate 31 in the opening 8; and the first sealing material 71 seals at least part of the semiconductor element 1 and the opening 8.

In the semiconductor device according to the second embodiment, a structure is adopted, in which: the semiconductor element 1 is bonded directly onto the heat dissipation plate 31. Therefore, in a die-bonding step of the manufacturing steps or temperature cycles in reliability evaluation, large thermal stress is generated in a die-bonding portion (i.e., the bonding material 2 that bonds the semiconductor element 1 and the heat dissipation plate 31) due to a mismatch between the thermal expansion coefficients of the semiconductor element 1 and the heat dissipation plate 31. As a result, there is the possibility that a crack or the like may occur in the die-bonding portion so that heat dissipation deteriorates.

If the area ranging from the inside of the opening 8 to the wiring member 4 is sealed, for example, only with silicone gel, the force by which the semiconductor element 1 and a bonding material 2 are held is small since the silicone gel is relatively soft, and the deterioration of the bonding material 2 cannot be suppressed.

Alternatively, if the area ranging from the inside of the opening 8 to the wiring member 4 is sealed, for example, only with an epoxy resin, the thermal expansion coefficient of the epoxy resin, adjusted to the thermal expansion coefficient of Cu that forms the heat dissipation plate 31, is within the range of 15 ppm/K to 20 ppm/K (inclusive). On the other hand, the thermal expansion coefficient in the thickness direction of glass epoxy that forms the insulating layer 32 is about 60 ppm/K, and hence peeling is likely to occur at the interface between the epoxy resin and the glass epoxy during temperature cycles. Since the peeling propagates toward the outside of the peeled portion, the outside having large thermal stress, there is high possibility that the wiring member 4 bonded to the surface of the conductive layer 33 may be damaged. Further, the epoxy resin is also peeled between the epoxy resin and the conductive layer 33 in a reliability test such as a thermal shock test or an intermittent current test, and hence it has been confirmed that it is difficult to extend the life of the semiconductor device. Since the adhesion of a common epoxy resin to the conductive layer 33 formed of Au or the like is not so good, it is considered that the peeling has occurred by the thermal stress continuously applied in the above reliability test. In addition, an epoxy resin has a high Young's modulus and the adhesion to the wiring member 4 is relatively good, and hence when the epoxy resin is peeled off the conductive layer 33, it lifts the wiring member 4 together. This is the same even in a structure in which the opening 8 is not provided like the first embodiment, and if the wiring member 4 is covered with an epoxy resin such that the end of the wiring member 4 is the starting point or end point, the peeling of the epoxy resin occurs with the conductive layer 33 located directly below it as the starting point.

In the second embodiment, the inside of the opening 8 of a base substrate 3 is sealed with the relatively hard first sealing material 71, and the wiring member 4 outside the opening 8 is sealed with the relatively soft second sealing material 72, as illustrated in FIG. 3. The bonding material 2, which is susceptible to the influence of the thermal stress occurring due to the difference between the thermal expansion coefficients of the semiconductor element 1 and the heat dissipation plate 31, is reinforced by the relatively hard first sealing material 71. Further, by sealing the wiring member 4 with the relatively soft second sealing material 72, the wiring member 4 can be protected from dust and thermal stress to the wiring member 4 can be reduced even if a warp is caused in the base substrate 3. Therefore, the reliability of the semiconductor device can be improved.

In the opening 8 in the semiconductor device according to the second embodiment, one main surface of the insulating layer 32, i.e., the upper surface of the insulating layer 32 is arranged to be higher than the upper surface of the semiconductor element 1. By arranging the upper surface of the insulating layer 32 so as to be higher than the upper surface of the semiconductor element 1, the semiconductor element 1 can be sealed just enough with the first sealing material 71 without the first sealing material 71 greatly swelling from the opening 8.

In the semiconductor device according to the second embodiment, the insulating layer 32 is glass epoxy and the first sealing material 71 is an epoxy resin. Since an epoxy resin has high adhesion to glass epoxy, the first sealing material 71 satisfactorily adheres to a side surface 32a of the insulating layer 32 in the opening 8. As a result, peeling of the first sealing material 71 from the heat dissipation plate 31, which may be caused due to the thermal stress or a warp that may be caused: in a die-bonding step of the manufacturing steps; in temperature cycles in reliability evaluation; or the like, can be suppressed.

In the semiconductor device according to the second embodiment, the first sealing material 71 is an epoxy resin and the second sealing material 72 is silicone gel. Since the thermal conductivity of an epoxy resin is generally higher than that of silicone gel, the heat dissipation of the semiconductor device is improved by sealing the semiconductor element 1 with an epoxy resin.

In the semiconductor device according to the second embodiment, the bonding material 2 that bonds the semiconductor element 1 and the heat dissipation plate 31 is a conductive resin, and the conductive resin contains one of an epoxy resin, an acrylic resin, and silicone rubber, and metal fillers. As the bonding material 2 that bonds the semiconductor element 1 and the heat dissipation plate 31, a conductive adhesive containing metal fillers such as Ag, Au, or Cu may be used. When the conductive adhesive is used, not only the metal fillers but also an epoxy resin, a silicone resin, or an acrylic resin exist in the surface of a fillet portion, and the adhesion of the conductive adhesive to the first sealing material 71 is more excellent compared to a solder fillet. Therefore, the first sealing material 71 can hold the bonding material 2 more firmly, and the reliability of the semiconductor device can be further improved.

In the semiconductor device according to the second embodiment, the bonding material 2 that bonds the semiconductor element 1 and the heat dissipation plate 31 may be a sinterable bonding material. The surface of the bonding material 2 may also be porous.

As the bonding material 2 that bonds the semiconductor element 1 and the heat dissipation plate 31, a sinterable metal paste may be used, in which micro-sized metal particles, nano-sized metal particles, or micro-sized and nano-sized metal particles are mixed in a solvent. The sinterable metal (e.g., Ag, Au, Cu, or the like) paste can be die-bonded at a low temperature lower than or equal to about 200° C. like the conductive adhesive, and in addition metal particles are sinter-bonded together after sintering to produce a state close to a metal-bulk state, and hence very high-adhesion, -thermal conductivity, and -heat resistance can be obtained. As a result, the reliability during high temperature operation at 175° C. or higher can be improved. When the metal sintering material is used, many holes, from which the volatilized solvent has been released at the time of sintering, are formed on the surface of a fillet portion, and hence the fillet portion has a porous structure. Therefore, the first sealing material 71 injected into the opening 8 of the base substrate 3 penetrates into the holes of the fillet portion, which improves adhesion by an anchor effect. Therefore, the first sealing material 71 can hold the bonding material 2 more firmly, and the reliability of the semiconductor device can be further improved.

There are two types of the above sinterable metal paste, including one type that needs pressure during sintering and the other type that does not need pressure. In the case of the type that needs pressure, it is necessary to provide a shock absorber between the chip-shaped semiconductor element 1 and a pressure unit of a pressure apparatus since pressure cannot be applied directly to the surface of the semiconductor element 1 by the pressure apparatus. In addition, any foreign matter attached to the surface of the semiconductor element 1 can cause a scratch in the semiconductor element 1, and hence the type that needs pressure is not so suitable for the bonding material 2 to be used in a high frequency semiconductor element with a delicate surface. On the other hand, in the case of a sinterable metal paste, the other type that does not need pressure, the tackiness of the paste is lost when temporarily sintered and its bonding strength, which is small compared to that of the pressure type, becomes still smaller, and hence it is desirable to complete sintering by one-time heating.

Third Embodiment

Figure 10:
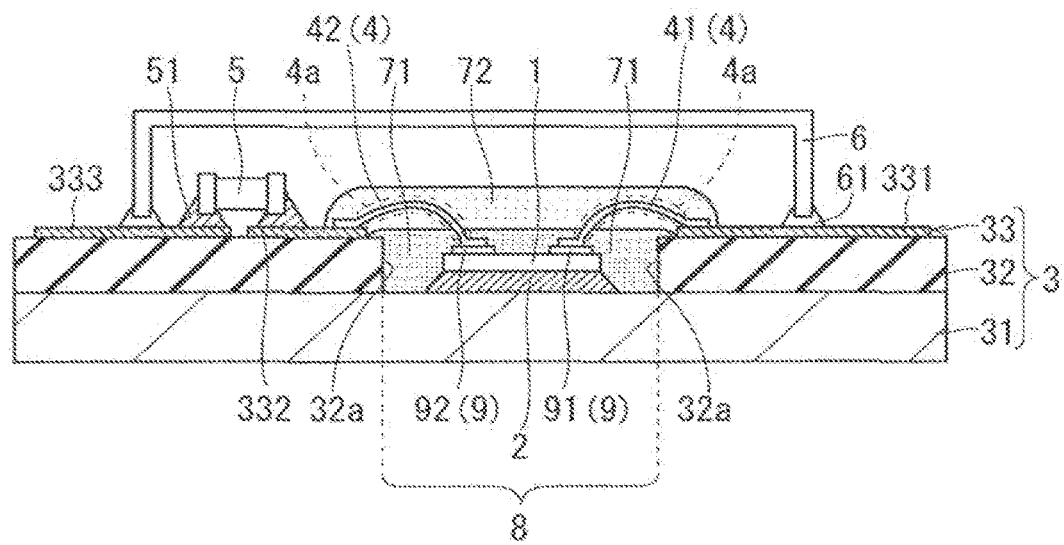
FIG. 10 is a cross sectional view of a semiconductor device according to a third embodiment.
Figure 11:
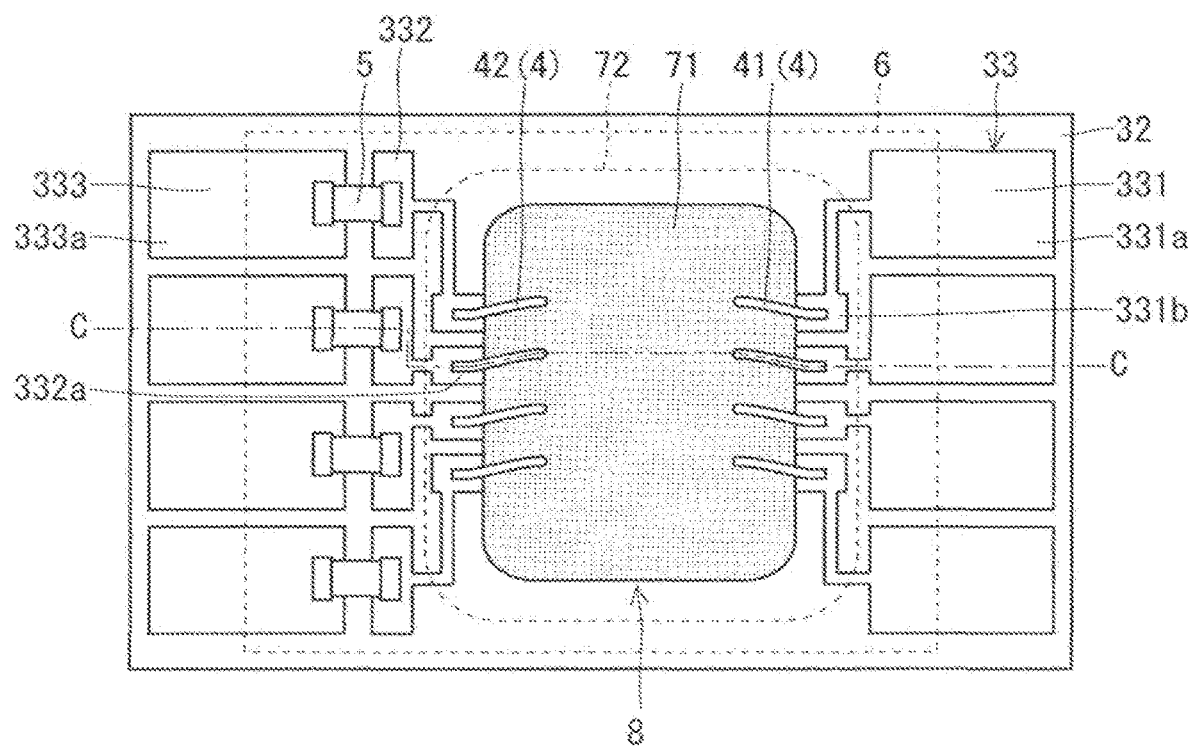
FIG. 11 is a plan view of the semiconductor device according to the third embodiment.

FIG. 10 is a cross sectional view of a semiconductor device according to a third embodiment. FIG. 11 is a plan view of the semiconductor device according to the third embodiment. The cross section of the semiconductor device illustrated in FIG. 10 is taken along line C-C of FIG. 11. In FIG. 11, a second sealing material 72 and a cap 6 are illustrated by virtual lines for easy understanding of the drawing.

In the third embodiment, an opening 8 of a base substrate 3 is also sealed with a first sealing material 71 like the second embodiment. In the third embodiment, the opening 8 is further filled with the first sealing material 71 to a height higher than or equal to the height of one main surface (i.e., the upper surface) of an insulating layer 32, as illustrated in FIG. 10. The first sealing material 71 is arranged such that it may be in contact with the side surface of a conductive layer 33 but it is not in contact with the upper surface of the conductive layer 33.

Figure 12:
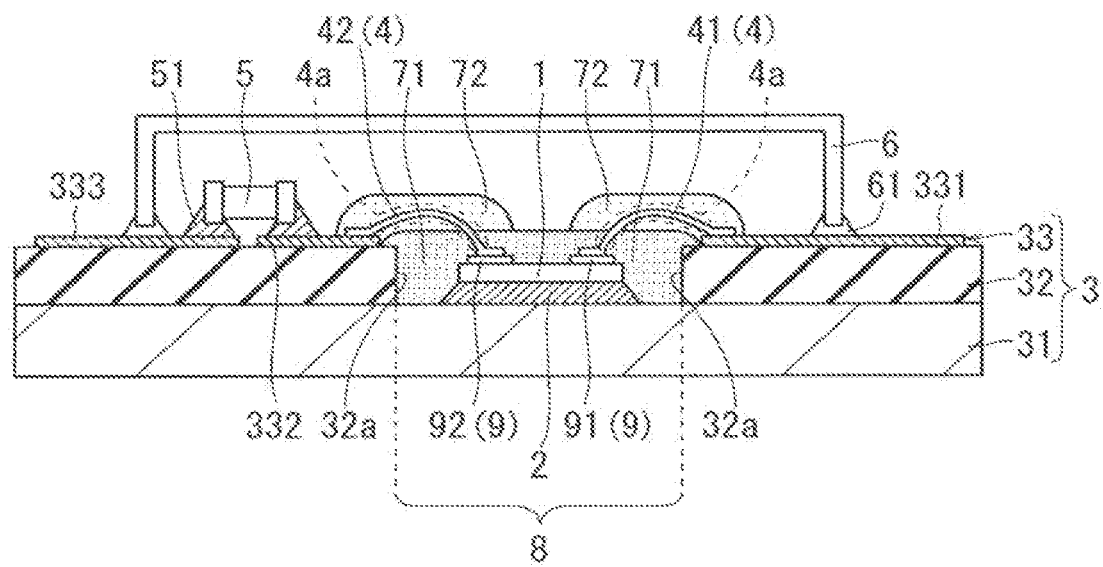
FIG. 12 is a cross sectional view of a semiconductor device according to a variation of the third embodiment.

FIG. 12 is a cross sectional view illustrating a variation of the semiconductor device according to the third embodiment. As illustrated in FIG. 12, a second sealing material 72 may be arranged in a divided shape. In this case, the second sealing material 72 is applied in two steps in a manufacturing step. Since the second sealing material 72 is applied in two steps, an application amount per step can be reduced, which makes it easy to adjust an application amount for sealing the wiring member 4 just enough.

Since other configurations of the semiconductor devices of the third embodiment and the variation of the third embodiment are the same as the semiconductor device of the second embodiment, description thereof will be omitted.

<Effects>

In the semiconductor device according to the third embodiment, the opening 8 is filled with the first sealing material 71 to a height higher than or equal to the height of the one main surface of the insulating layer 32. Thereby, the contact area between the first sealing material 71 and a side surface 32a of the insulating layer 32 is increased, and hence the adhesion between the first sealing material 71 and a heat dissipation plate 31 is increased and the reliability of the semiconductor device can be further improved. In particular, when the insulating layer 32 is glass epoxy and the first sealing material 71 is an epoxy resin, an epoxy resin has high adhesion to glass epoxy, and hence the first sealing material 71 satisfactorily adheres to the side surface 32a of the insulating layer 32 in the opening 8. Therefore, the adhesion between the first sealing material 71 and the heat dissipation plate 31 is further improved, and the reliability of the semiconductor device can be further improved.

In order to confirm effects of improving the adhesion in the third embodiment 3, a resin adhesion strength test (i.e., a pudding-cup test) was carried out. In the resin adhesion strength test, a first sample was made, in which a stainless steel cup (diameter: 6 mm, height: 4 mm) was mounted on a copper plate whose surface was plated with Ni or Au and then an epoxy resin was applied. Then, a second sample was made, in which a stainless steel cup was mounted on a glass epoxy plate and an epoxy resin was applied. The epoxy resin of each sample was cured under the recommended conditions. As a result of carrying out a shear test for the first sample in each of a room temperature atmosphere and 150° C. atmosphere, shear strength was 20 kg and 10 kg. As a result of carrying out a shear test for the second sample in each of a room temperature atmosphere and 150° C. atmosphere, shear strength was 42 kg and 38 kg. From the above results, it was found that the adhesion of the epoxy resin to the glass epoxy plate was two times or more than the adhesion to the copper plate. It was also found that high adhesion was maintained even in a high temperature atmosphere as high as 150° C. From the above tests, it was confirmed that the reliability of the semiconductor device can be improved by increasing the contact area between the epoxy resin as the first sealing material 71 and the glass epoxy as the insulating layer 32.

Fourth Embodiment

Figure 13:
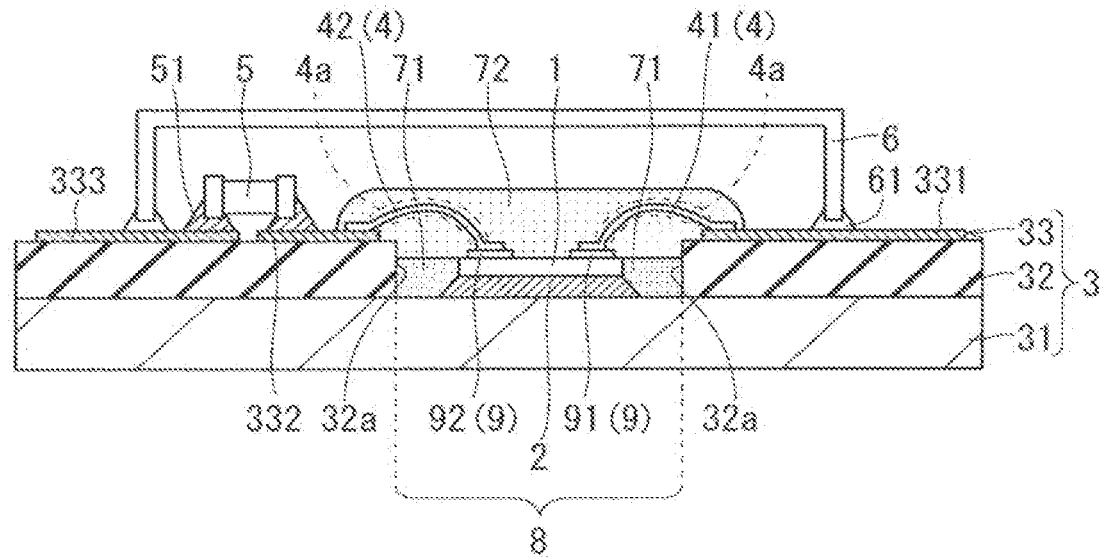
FIG. 13 is a cross sectional view of a semiconductor device according to a fourth embodiment.
Figure 14:
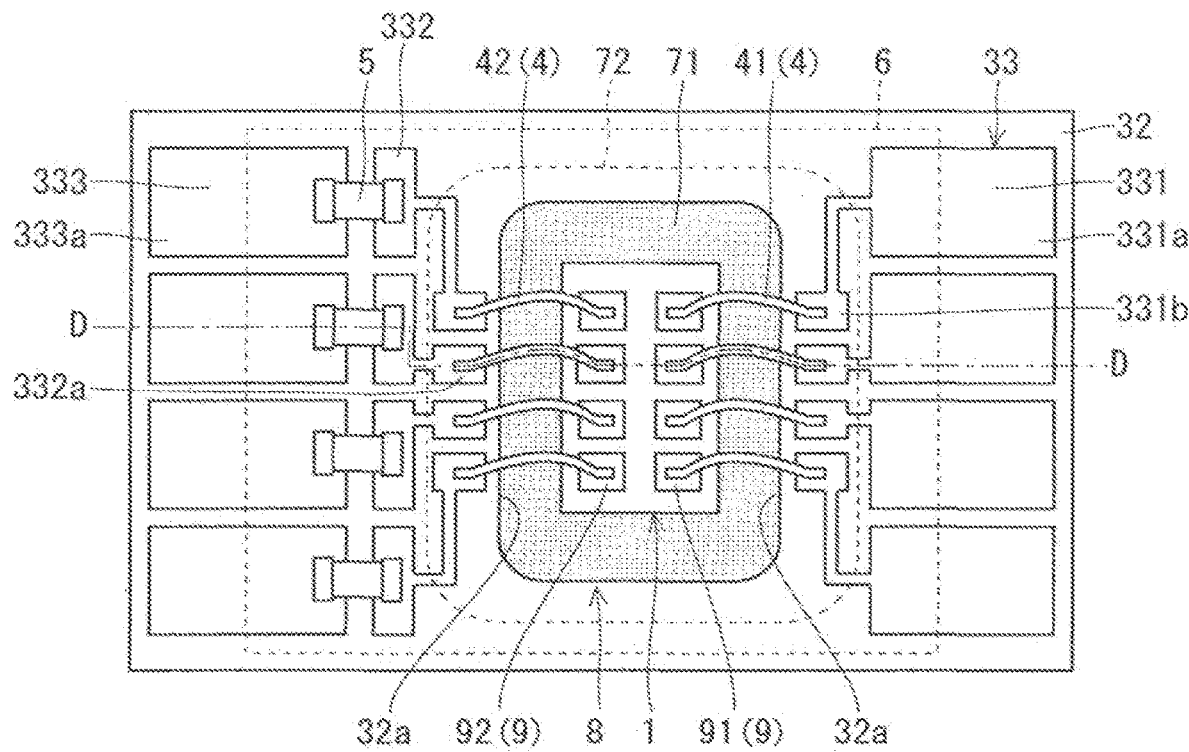
FIG. 14 is a plan view of the semiconductor device according to the fourth embodiment.

FIG. 13 is a cross sectional view of a semiconductor device according to a fourth embodiment. FIG. 14 is a plan view of the semiconductor device according to the fourth embodiment. The cross section of the semiconductor device illustrated in FIG. 13 is taken along line D-D of FIG. 14. In FIG. 14, a second sealing material 72 and a cap 6 are illustrated by virtual lines for easy understanding of the drawing.

In the fourth embodiment, an opening 8 of a base substrate 3 is also sealed with a first sealing material 71 like the second embodiment. In the fourth embodiment, the first sealing material 71 seals part of a semiconductor element 1 so as not to be in contact with a wiring member 4. A second sealing material 72 seals the whole of the wiring member 4.

That is, the first sealing material 71 is arranged such that it may be in contact with the side surface of the semiconductor element 1 but may not be in contact with the upper surface of the semiconductor element 1. However, unless the first sealing material 71 is not in contact with a hollow portion 4a of the wiring member 4, the first sealing material 71 may cover the upper surface of the semiconductor element 1. The second sealing material 72 may be in contact with at least the whole of the hollow portion 4a of the wiring member 4.

Figure 19:
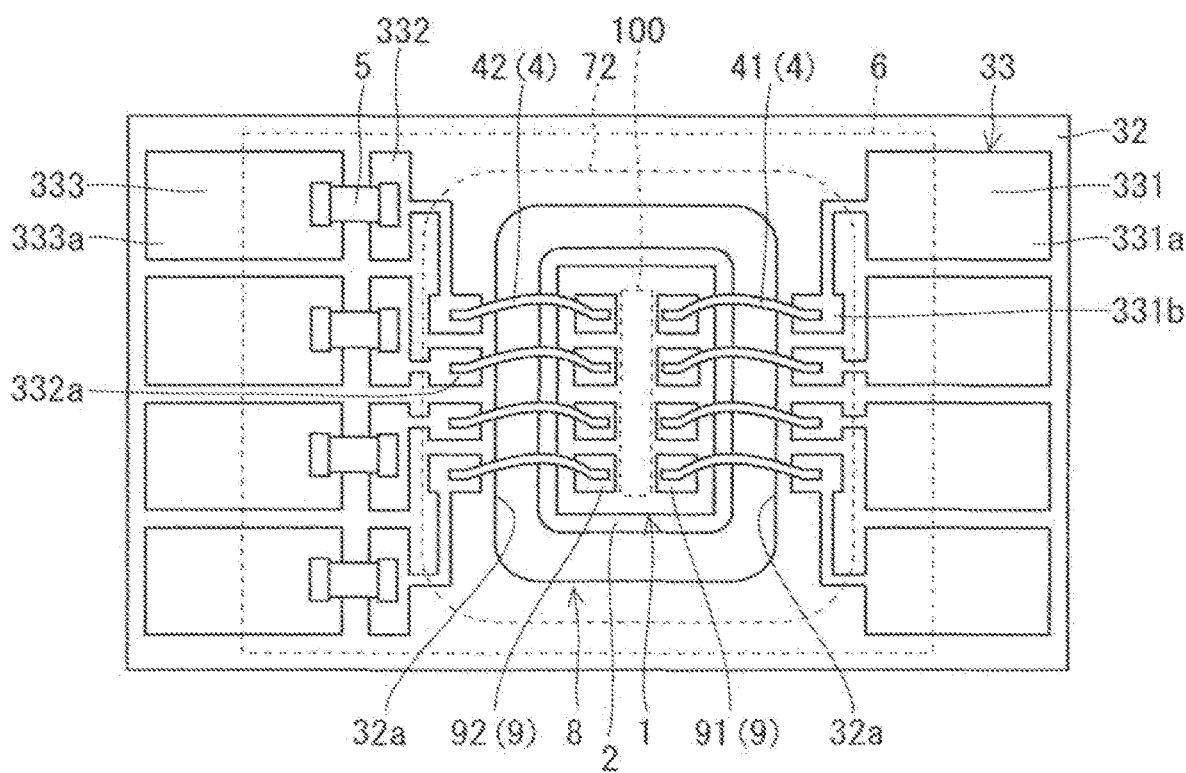
FIG. 19 is a plan view schematically illustrating an air bridge existing area.

In semiconductor devices handling high frequency signals, a coplanar line type MMIC (Monolithic Microwave Integrated Circuit) is known as one of the common configurations of MMICs in which an active element and a passive element can be collectively formed on a semiconductor substrate. In the coplanar line type MIMIC, a fine air bridge of about several μm may be arranged on the surface of the semiconductor element 1. As illustrated in FIG. 19 described later, the semiconductor element 1 is provided with an air bridge existing area 100 between upper electrodes 91 and 92. The air bridge is provided above the air bridge existing area 100. The case is considered, in which the air bridge, which is one wiring structure, is covered with a hard resin like an epoxy resin. In this case, there is the possibility that the fine air bridge may be crushed by the hardness of the cured epoxy resin or by the stress of the epoxy resin occurring during cure shrinkage.

Therefore, it is preferable that the first sealing material 71 seals part of the semiconductor element 1 so as not to be in contact with the air bridge and the upper surface of the semiconductor element 1 without covering the entire surface of the semiconductor element 1, as illustrated in FIG. 14.

Since other configurations of the semiconductor device of the fourth embodiment are the same as the semiconductor device of the second embodiment, description thereof will be omitted.

<Effects>

In the semiconductor device according to the fourth embodiment, the first sealing material 71 seals at least part of the semiconductor element 1 so as not to be in contact with the hollow portion 4a of the wiring member 4, and the second sealing material 72 is in contact with the whole of the hollow portion 4a of the wiring member 4.

At the interface where a hard sealing material and a soft sealing material are in contact with each other, there is the possibility that the stress, occurring due to the differences between the Young's moduli of the two sealing materials and between the thermal expansions thereof, may concentrate during a temperature cycle test and a power cycle test. Also, the amount of moisture absorbed from the outside is increased at the interface, even though the hard sealing material and the soft sealing material adhere together. There is the possibility that a wire may deteriorate due to a lot of moisture absorption, so that wire disconnection is accelerated. In the fourth embodiment, the second sealing material 72 is in contact with the hollow portion 4a of the wiring member. That is, the interface between the first sealing material 71 and the second sealing material 72 is not in contact with the hollow portion 4a of the wiring member 4, and hence disconnection of the wiring member 4, which may be caused by stress, can be suppressed. Further, deterioration of the wiring member 4, which may be caused by moisture, can be suppressed. Furthermore, the whole of the hollow portion 4a of the wiring member 4 is sealed with the soft second sealing material 72, and hence the influence of stress given to the wiring member 4 can be reduced, and the reliability of the semiconductor device can be further improved.

Fifth Embodiment

Figure 15:
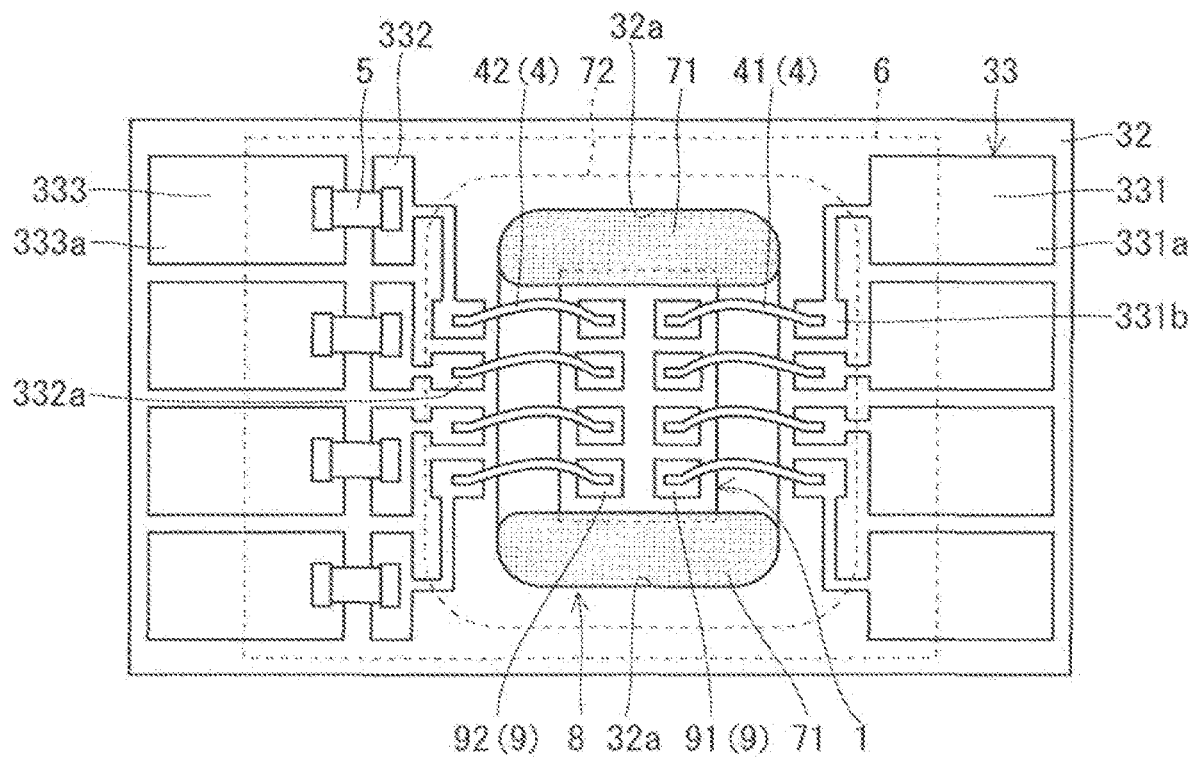
FIG. 15 is a plan view of a semiconductor device according to a fifth embodiment.

FIG. 15 is a plan view of a semiconductor device according to a fifth embodiment. In FIG. 15, a second sealing material 72 and a cap 6 are illustrated by virtual lines for easy understanding of the drawing. In the second embodiment, the whole of the opening 8 of the base substrate 3 is sealed with the first sealing material 71.

On the other hand, in the fifth embodiment, a semiconductor element 1 has a rectangular shape in plan view, and the four corners and the short sides facing each other of the semiconductor element 1 are sealed with a first sealing material 71, as illustrated in FIG. 15. The first sealing material 71 is also in contact with a side surface 32a of an insulating layer 32 near to the short side of the semiconductor element 1, and the first sealing material 71 has sufficient adhesion strength. Also, in the fifth embodiment, it is desirable to arrange the first sealing material 71 so as not to be in contact with a hollow portion 4a of a wiring member 4 like the fourth embodiment.

As illustrated in FIG. 15, a portion of the opening 8 that is not sealed with the sealing material 71 is sealed with the second sealing material 72. Also, the wiring member 4 is sealed with the second sealing material 72. Since other configurations of the semiconductor device of the fifth embodiment are the same as the semiconductor device of the second embodiment, description thereof will be omitted.

<Effects>

In the fifth embodiment, the semiconductor element 1 has a rectangular shape in plan view, and the first sealing material 71 seals the four corners of the semiconductor element 1, and the first sealing material 71 extends, of two pairs of the sides facing each other in plan view, along any one of the pairs of the sides facing each other.

Therefore, by the first sealing material 71 sealing both the four corners of the semiconductor element 1 and, of two pairs of the sides facing each other, any one of the pairs of the sides facing each other, the semiconductor element 1 can be firmly adhered and fixed to a heat dissipation plate 31 with a smaller amount of the sealing material compared to the case where the whole of the semiconductor element 1 is sealed with the first sealing material 71.

Air is generally likely to be involved when a resin such as an epoxy resin is poured into a recess of a substrate in a manufacturing step. Therefore, there is the possibility that a void, i.e., a bubble may be formed in a sealed portion after the epoxy resin is cured. As measures against this, for example, the viscosity of the resin is lowered by warming the substrate in advance, which can suppress the involvement of air. Alternatively, a vacuuming mechanism is added, which can remove a void before curing. However, additional capital investment through equipment remodeling and addition of a manufacturing step are needed in any measure. Then, the first sealing material 71 is arranged only in the minimum required places in the opening 8, as in the fifth embodiment, which can greatly reduce the amount of the first sealing material 71 to be used for sealing. By reducing the amount of the first sealing material 71 to be arranged, the possibility that a void may be formed in the first sealing material 71 can be reduced without additional capital investment and addition of a manufacturing step.

In the semiconductor device according to the fifth embodiment, the first sealing material 71 extends, of two pairs of the sides facing each other in plan view of the semiconductor element 1, along a pair of the shorter sides facing each other. When the first sealing material 71 is arranged along the short sides facing each other, as illustrated in FIG. 15, the amount of the first sealing material 71 arranged is smaller compared to when the first sealing material 71 is arranged along the long sides facing each other. Therefore, the possibility that a void may be caused in the first sealing material 71 can be further reduced. Further, the four corners of the semiconductor element 1, where stress is generated, are covered with the first sealing material 71, and hence the reliability of the semiconductor device is sufficiently ensured.

Sixth Embodiment

Figure 16:
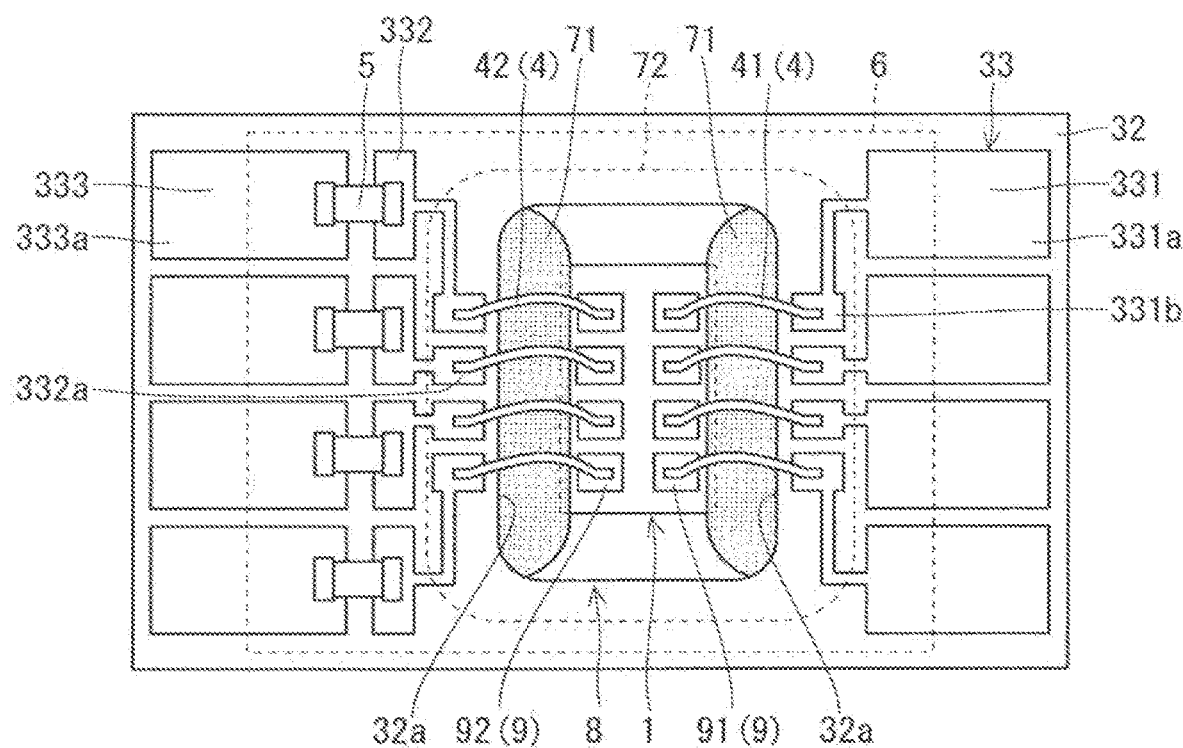
FIG. 16 is a plan view of a semiconductor device according to a sixth embodiment.

FIG. 16 is a plan view of a semiconductor device according to a sixth embodiment. In FIG. 16, a second sealing material 72 and a cap 6 are illustrated by virtual lines for easy understanding of the drawing. In the fifth embodiment, the four corners and the short sides facing each other of the semiconductor element 1 are sealed with the first sealing material 71. On the other hand, in the sixth embodiment, the four corners and the long sides facing each other of a semiconductor element 1 are sealed with a first sealing material 71. Since other configurations of the semiconductor device of the sixth embodiment are the same as the semiconductor device of the fifth embodiment, description thereof will be omitted.

<Effects>

In the semiconductor device according to the sixth embodiment, the first sealing material 71 extends, of two pairs of the sides facing each other in plan view of the semiconductor element 1, along a pair of the longer sides facing each other. In the sixth embodiment, the long sides facing each other are sealed with the first sealing material 71 instead of the short sides facing each other, and hence the semiconductor element 1 and a bonding material 2 can be held more firmly with a small amount of the first sealing material 71. Therefore, a reduction in the possibility that a void may be generated in the first sealing material 71 and high reliability of the semiconductor device can be both achieved.

Seventh Embodiment

Figure 17:
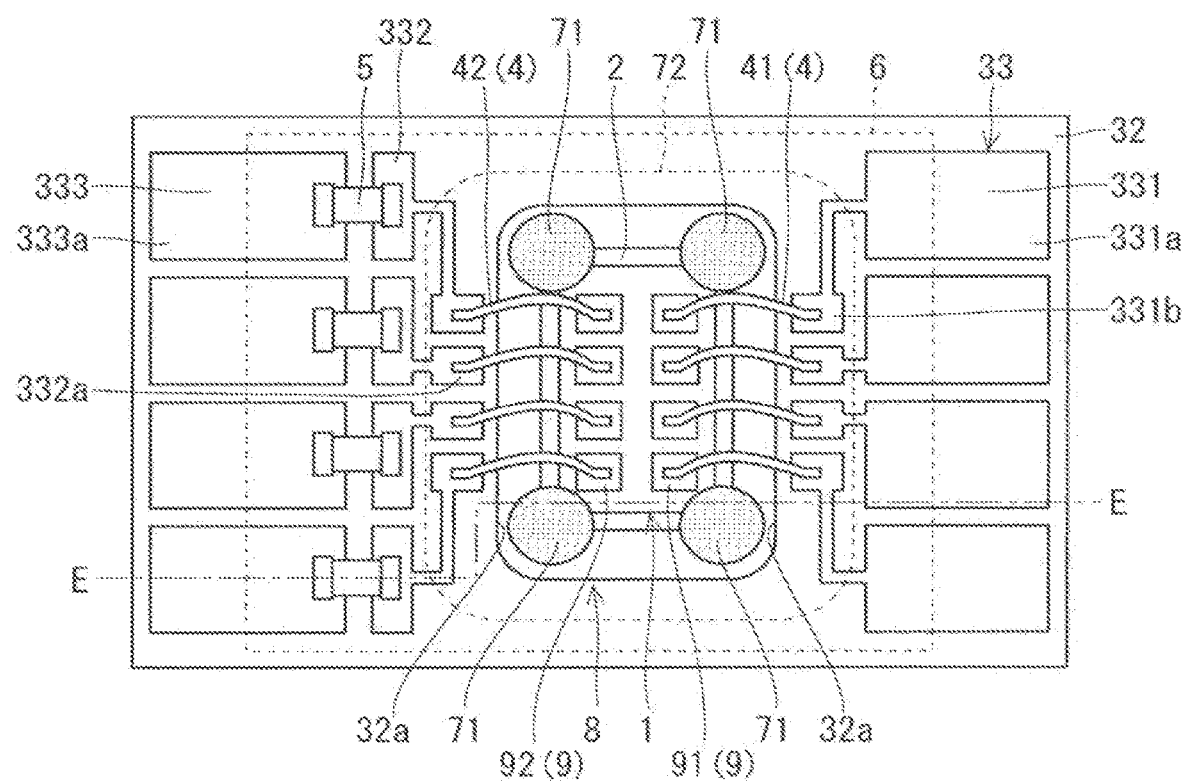
FIG. 17 is a plan view of a semiconductor device according to a seventh embodiment.
Figure 18:
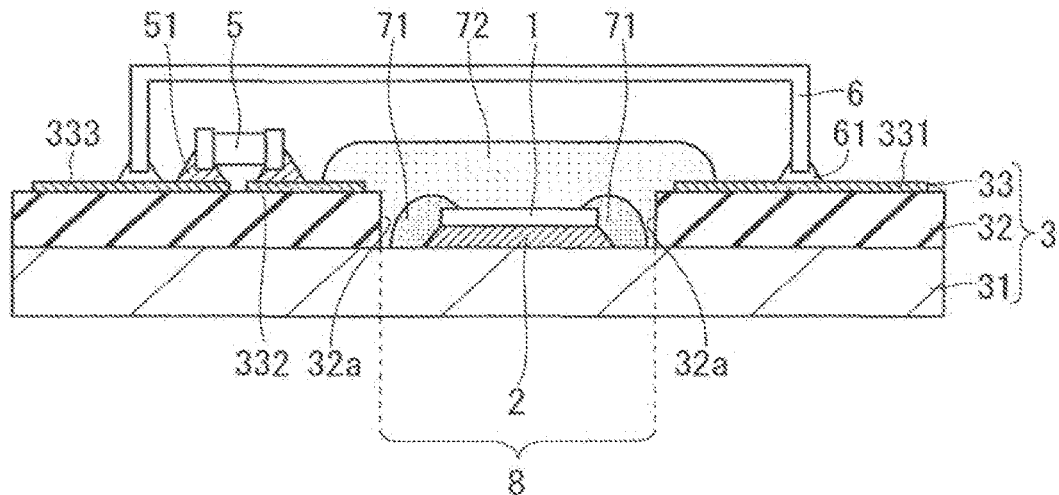
FIG. 18 is a cross sectional view of the semiconductor device according to the seventh embodiment.

FIG. 17 is a plan view of a semiconductor device according to the seventh embodiment. FIG. 18 is a cross sectional view of the semiconductor device according to the seventh embodiment. The cross section of the semiconductor device illustrated in FIG. 18 is taken along line E-E of FIG. 17. In FIG. 17, a second sealing material 72 and a cap 6 are illustrated by virtual lines for easy understanding of the drawing. FIG. 19 is a plan view schematically illustrating an air bridge existing area 100. In FIG. 19, a first sealing material 71 is not illustrated.

In the fifth embodiment, the four corners and the short sides facing each other of the semiconductor element 1 are sealed with the first sealing material 71, and in the sixth embodiment, the four corners and the long sides facing each other of the semiconductor element 1 are sealed with the first sealing material 71. On the other hand, in the seventh embodiment, the four corners of a semiconductor element 1 are only sealed with the first sealing material 71.

That is, in the semiconductor device of the seventh embodiment, the semiconductor element 1 has a rectangular shape in plan view, the first sealing material 71 seals the four corners of the semiconductor element 1, the first sealing material 71 is discrete in each of the four corners of the semiconductor element 1, and the first sealing material 71 is present in the four places.

The first sealing material 71 seals each of the four corners of the semiconductor element 1 such that each corner is not exposed. Also, the first sealing material 71 only seals the four corners of the semiconductor element 1, the four corners being the minimum required places, and hence it is necessary that the first sealing material 71 is surely in contact with the semiconductor element 1, a bonding material 2, and a heat dissipation plate 31 in an opening 8.

On the other hand, it is preferable that the first sealing material 71 seals such that it is not in contact with the air bridge existing area 100 illustrated in FIG. 19, in order to prevent the deterioration of high frequency characteristics as much as possible. Since the first sealing material 71 in the seventh embodiment is formed to be discrete in each of the four corners, it is not in contact with the air bridge existing area 100 between upper electrodes 91 and 92 and the semiconductor element 1 can be sealed with the first sealing material 71.

The semiconductor element 1 to be used in a high frequency semiconductor device often has a rectangular shape, and hence the semiconductor element 1 is more likely to tilt along the longitudinal direction of the semiconductor element 1 after being die-bonded to form the bonding material 2, compared to a square shape.

Figures 20, 21:
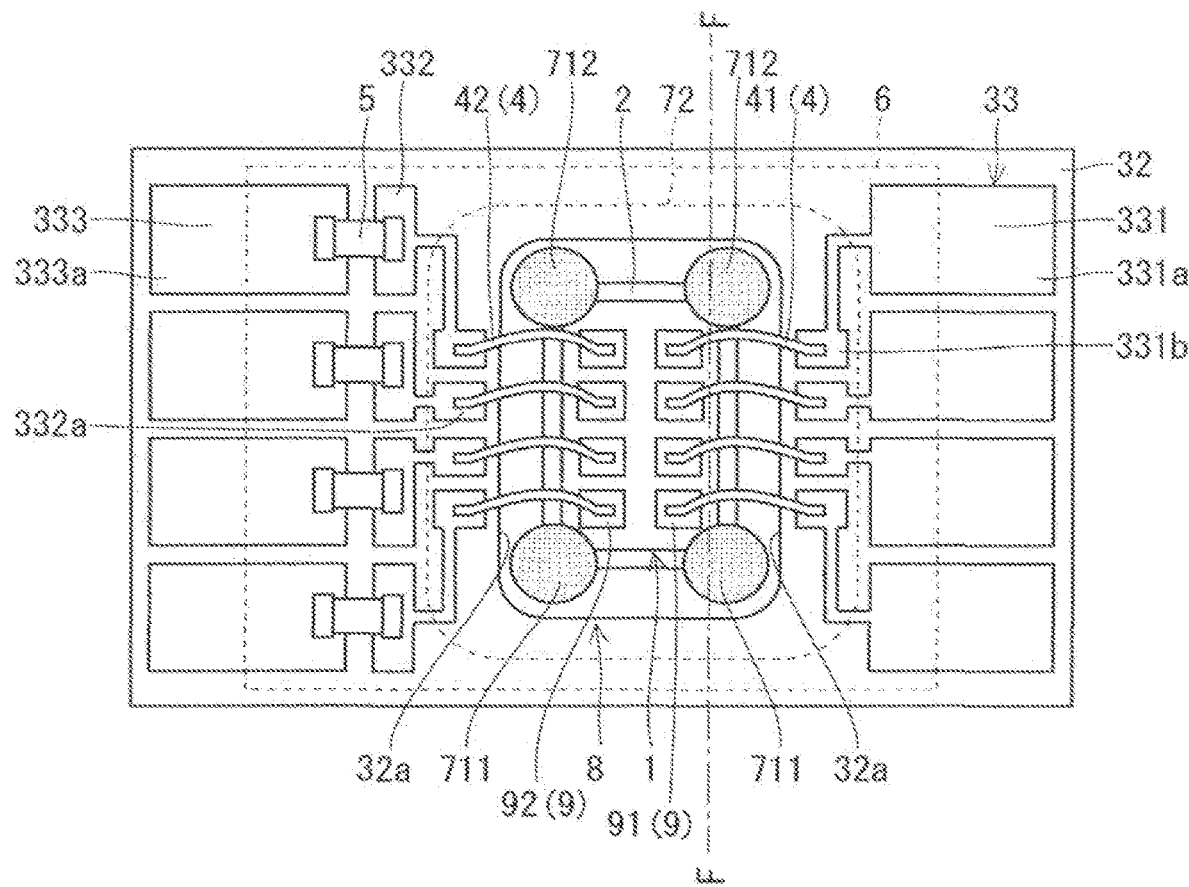
FIG. 20 is a plan view of a semiconductor device according to a variation of the seventh embodiment.
FIG. 21 is a cross sectional view of the semiconductor device according to the variation of the seventh embodiment.

FIG. 20 is a plan view of a semiconductor device according to a variation of the seventh embodiment. FIG. 21 is a cross sectional view of the semiconductor device according to the variation of the seventh embodiment. The cross section of the semiconductor device illustrated in FIG. 21 is taken along line F-F of FIG. 20. In FIG. 20, a second sealing material 72 and a cap 6 are illustrated by virtual lines for easy understanding of the drawing. In the variation of the seventh embodiment, a structure is adopted, in which it is assumed that a semiconductor element 1 tilts along the longitudinal direction.

As illustrated in FIGS. 20 and 21, a structure is adopted, in which the bonding material 2 is provided such that, of two pairs of sides facing each other in plan view of the semiconductor element 1, the thickness of the bonding material 2, on one side of a pair of the shorter sides facing each other, is smaller than the thickness thereof on another side of the pair. That is, in the variation of the seventh embodiment, it is assumed that a structure is adopted, in which the bonding material 2 is provided such that, of the short sides facing each other in plan view of the semiconductor element 1, the thickness of the bonding material 2, on one side of the short sides, is smaller than the thickness thereof on the other side of the short sides.

In the seventh embodiment, the first sealing material 71 is formed to be isolated in the four corners of the semiconductor element 1 by a dispensing apparatus. That is, the first sealing material 71 is composed of two first sealing materials 711 and 711 and two first sealing materials 712 and 712. And, as illustrated in FIG. 21, an application amount is changed between the first sealing materials 711 and 712, corresponding to the tilt of the semiconductor element 1.

As illustrated in FIGS. 20 and 21, of the four corners of the semiconductor element 1, in two corners in each of which the bonding material 2, which is a die-bonding layer, is formed to be relatively thin, a relatively large application amount of the first sealing material 712, is provided, and in two corners in each of which the bonding material 2 is formed to be relatively thick, a relatively small application amount of the first sealing material 711 is provided, the application amount being a formation amount.

Thus, the variation of the seventh embodiment has the feature that the application amount of the first sealing material 712, in each of the two corners on one side of the short sides, where the bonding material 2 is formed to be relatively thin, is larger than the application amount of the first sealing material 711 in each of the two corners on the other side of the short sides, where the bonding material 2 is formed to be relatively thick, the application amount being a formation amount. That is, in the variation of the seventh embodiment, the first sealing material 71 composed of the two first sealing materials 711 and the two first sealing materials 712 is provided such that the formation amount in each of the two corners on one side of the short sides is larger than the formation amount in each of the two corners on the other side of the short sides.

As a result, the thermal stress applied to the bonding material 2 between the first sealing materials 711 and 712 can be entirely balanced. It is also desirable that the height of the first sealing materials 711 and 712 is smaller than the formation height of an insulating layer 32, and the first sealing materials 711 and 712 are contained in an opening 8. The application amount of each of the first sealing materials 711 and 712 can be determined before being manufactured based on the thickness of the bonding material 2 in each corner, after approximate stress to be applied to the bonding material 2 is estimated in advance by using simulation or the like and then the stress is accurately predicted by a test using a real device since the stress applied to the bonding material 2 varies depending on the physical properties and size of each member.

Since other configurations of the semiconductor device of the seventh embodiment are the same as the semiconductor devices of the fifth embodiment and the sixth embodiment, description thereof will be omitted.

<Effects>

The semiconductor element to be used in a high frequency semiconductor device often has a rectangular shape in plan view, and hence the semiconductor element 1 is more likely to tilt along the longitudinal direction of the semiconductor element 1 after being die-bonded to form the bonding material 2, compared to a square shape. Therefore, the thickness of the bonding material 2, which is a die-bonding layer, varies also in the four corners of the semiconductor element 1, as described above. Generally speaking, stress relaxation is large when the thickness of the bonding material 2 is large, and is small when the thickness of the bonding material 2 is small. Therefore, if the thickness of the bonding material 2 in the four corners of the semiconductor element 1 varies, the reliability on a thermal shock test in the four corners, or the like also varies, whereby the bonding material 2 may deteriorate from the weakest corner, so that the reliability is limited by the weakest corner.

Then, as illustrated in FIG. 21, by setting different application amounts of the first sealing materials 711 and 712 corresponding to the tilt of the semiconductor element 1, i.e., to the thickness of the bonding material 2, the stress relaxation in the four corners can be equalized, the application amounts being formation amounts. Thus, high reliability can be obtained.

In the seventh embodiment, the first sealing material 71 is provided to be isolated in each of the four corners of the semiconductor element 1. Therefore, when it is assumed that a structure is adopted, in which the bonding material 2 is provided to have a different thickness in each of the four corners facing each other in plan view of the semiconductor element 1, the application amount of the first sealing material 71 in each of the four corners of the semiconductor element 1 can be set to a different amount, corresponding to the thickness of the bonding material 2. As a result, in the semiconductor device of the seventh embodiment, the stress relaxation of the bonding material 2 in the four corners can be equalized even when the bonding material 2 is provided to have a different thickness in each of the four corners.

In each of the first embodiment through the seventh embodiment, the first sealing material 71 may seal at least part of the semiconductor element 1 so as to be in directly contact with the semiconductor element 1. The second sealing material 72 may seal the wiring member 4 so as to be in directly contact with the wiring member 4. In the present invention, each embodiment can be freely combined or can be appropriately modified or omitted, within the scope of the present invention.

Although the present invention has been described in detail, the above description is an exemplification in all aspects, and the present invention is not limited thereto. It is understood that countless variations not illustrated can be conceived of without departing from the scope of the present invention.

The invention claimed is:
1. A semiconductor device comprising:
an insulating layer;
a conductive layer bonded to one main surface of the insulating layer;
a semiconductor element arranged such that an upper surface of the semiconductor element faces a direction same as the one main surface of the insulating layer,
an upper electrode provided on the upper surface of the semiconductor element;
a wiring member that has one end electrically bonded to the upper electrode of the semiconductor element and has another end electrically bonded to the conductive layer, and has a hollow portion;
a first sealing material; and
a second sealing material,
wherein
the first sealing material seals at least part of the semiconductor element so as to be in contact with the semiconductor element, the second sealing material seals the wiring member so as to be in contact with the wiring member,
the first sealing material is an epoxy resin, and
the second sealing material is silicone gel,
the semiconductor device further comprising
a heat dissipation plate,
wherein
another main surface of the insulating layer is bonded to one main surface of the heat dissipation plate,
an opening in the insulating layer where the heat dissipation plate is not covered with the insulating layer, the opening having a depth reaching to the heat dissipation plate,
a lower surface of the semiconductor element is bonded to the one main surface of the heat dissipation plate in the opening, the another main surface of the insulating layer being located a distance from the heat dissipation plate that is closer to or equal to a distance from the lower surface of the semiconductor element to the heat dissipation plate,
the first sealing material seals at least part of the semiconductor element and the opening, and
the first sealing material further seals one end of the wiring member, and the second sealing material further seals another end of the wiring member.

2. The semiconductor device according to claim 1, wherein the opening is filled with the first sealing material to a height higher than or equal to the one main surface of the insulating layer.

3. The semiconductor device according to claim 2, wherein in the opening, the one main surface of the insulating layer is arranged to be higher than the upper surface of the semiconductor element.

4. The semiconductor device according to claim 2, wherein a flexural modulus of the second sealing material is smaller than a flexural modulus of the first sealing material.

5. The semiconductor device according to claim 1, wherein an area where the wiring member is in contact with the second sealing material is larger than an area where the wiring member is in contact with the first sealing material.

6. The semiconductor device according to claim 1, wherein the wiring member is a wire.

7. The semiconductor device according to claim 1, wherein
the insulating layer is glass epoxy.

8. The semiconductor device according to claim 1, wherein
a bonding material that bonds the semiconductor element and the heat dissipation plate is a conductive resin, and the conductive resin contains one of an epoxy resin, an acrylic resin, and silicone, and a metal filler.

9. The semiconductor device according to claim 1, wherein the bonding material that bonds the semiconductor element and the heat dissipation plate is a sinterable bonding material.

10. The semiconductor device according to claim 1, wherein a surface of the bonding material that bonds the semiconductor element and the heat dissipation plate is porous.

11. The semiconductor device according to claim 1, wherein the semiconductor element is an element that amplifies or switches a high frequency signal.

12. The semiconductor device according to claim 11, wherein a material of the semiconductor element is a wide bandgap semiconductor.

* * * * *